(12) United States Patent
Kim et al.

(10) Patent No.: US 12,119,048 B2
(45) Date of Patent: Oct. 15, 2024

(54) SEMICONDUCTOR MEMORY DEVICES AND ELECTRONIC DEVICES INCLUDING THE SEMICONDUCTOR MEMORY DEVICES

(71) Applicant: Samsung Electronics Co., Ltd., Suwon-si (KR)

(72) Inventors: Seunghan Kim, Suwon-si (KR); Gunhee Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 100 days.

(21) Appl. No.: 17/964,092

(22) Filed: Oct. 12, 2022

(65) Prior Publication Data
US 2023/0335181 A1 Oct. 19, 2023

(30) Foreign Application Priority Data
Apr. 19, 2022 (KR) .......................... 10-2022-0048075

(51) Int. Cl.
| | | |
|---|---|---|
| *G11C 11/408* | (2006.01) | |
| *G11C 11/4093* | (2006.01) | |
| *G11C 11/4076* | (2006.01) | |
| *G11C 11/4096* | (2006.01) | |

(52) U.S. Cl.
CPC ...... *G11C 11/4093* (2013.01); *G11C 11/4082* (2013.01); *G11C 11/4076* (2013.01); *G11C 11/408* (2013.01); *G11C 11/4096* (2013.01)

(58) Field of Classification Search
CPC .......... G11C 11/4093; G11C 11/4082; G11C 11/4076; G11C 11/408; G11C 11/4096
USPC ..................................................... 365/189.05
See application file for complete search history.

(56) References Cited

U.S. PATENT DOCUMENTS

| | | |
|---|---|---|
| 5,666,494 A | 9/1997 | Mote, Jr. |
| 6,337,809 B1 | 1/2002 | Kim et al. |
| 8,331,122 B2 | 12/2012 | Sato et al. |
| 8,687,456 B2 | 4/2014 | Sato et al. |
| 8,908,406 B2 | 12/2014 | Kurokawa |
| 9,268,636 B2 | 2/2016 | Chung et al. |
| 9,299,429 B2 | 3/2016 | Lee et al. |
| 9,564,195 B2 | 2/2017 | Ji et al. |
| 9,632,856 B2 | 4/2017 | Chung et al. |

(Continued)

FOREIGN PATENT DOCUMENTS

| | | |
|---|---|---|
| KR | 20010068848 A | 7/2001 |
| KR | 20140108398 A | 9/2014 |
| KR | 20160069215 A | 6/2016 |

*Primary Examiner* — Ly D Pham
(74) *Attorney, Agent, or Firm* — Myers Bigel, P.A.

(57) ABSTRACT

A semiconductor memory device includes a data input/output (I/O) buffer, a data first-in/first-out (FIFO) circuit, an address comparing circuit. The data I/O buffer provides a memory cell array with write data. The data FIFO circuit includes plurality of data FIFO buffers which store read data that is read from the memory cell array in each of a plurality of read operations. The data FIFO circuit outputs data stored in one of the plurality of data FIFO buffers based on a plurality of sub matching signals. The address comparing circuit sequentially stores previous addresses accompanied by first commands designating the plurality of read operations and generates the plurality of sub matching signals based on a comparison of the previous addresses and a present address accompanied by a second command designating a present read operation.

20 Claims, 19 Drawing Sheets

(56) References Cited

U.S. PATENT DOCUMENTS

| | | |
|---|---|---|
| 10,224,080 B2 | 3/2019 | Funaki |
| 10,684,793 B2 | 6/2020 | Chung et al. |
| 2020/0097209 A1* | 3/2020 | Zhou ........................ G06F 3/064 |
| 2021/0295945 A1* | 9/2021 | Bassa ..................... G11C 29/24 |

* cited by examiner

SEMICONDUCTOR MEMORY DEVICES AND ELECTRONIC DEVICES INCLUDING THE SEMICONDUCTOR MEMORY DEVICES

CROSS-REFERENCE TO RELATED APPLICATION

This application claims the benefit of priority under 35 U.S.C. § 119 to Korean Patent Application No. 10-2022-0048075, filed on Apr. 19, 2022, in the Korean Intellectual Property Office, and the entire contents of the above-identified application are incorporated by reference herein.

TECHNICAL FIELD

The present disclosure relates to memories, and more particularly to semiconductor memory devices configured to output, and/or capable of outputting, data stored in data first-in/first-out (FIFO) instead of a memory cell array, and to electronic devices including the semiconductor memory devices.

BACKGROUND

A semiconductor memory device may be classified as a volatile memory device or a nonvolatile memory device. A volatile memory device may be a memory device that loses data stored therein at power-off (e.g., when power is removed or disconnected). As an example of a volatile memory device, a dynamic random access memory (DRAM) may be used in various devices such as a mobile system, a server, or a graphic device.

Semiconductor memory devices that are associated with graphic data may operate based on a clock signal that has a very high frequency and thus, when data is read from a memory cell array, power consumption and noise may increase.

SUMMARY

Example embodiments may provide a semiconductor memory devices capable of outputting data stored in data first-in/first-out (FIFO) instead of a memory cell array.

Some example embodiments may provide an electronic device including a semiconductor memory device capable of outputting data stored in data FIFO instead of a memory cell array.

According to some example embodiments, a semiconductor memory device may include a memory cell array, a data input/output (I/O) buffer, a data first-in/first-out (FIFO) circuit, an address comparing circuit and a control logic circuit. The memory cell array includes a plurality of volatile memory cells coupled to a plurality of word-lines and a plurality of bit-lines. The data I/O buffer provides the memory cell array with write data received in each of a plurality of write operations. The data FIFO circuit includes plurality of data FIFO buffers which store read data that is read from the memory cell array in each of a plurality of read operations. The data FIFO circuit outputs data stored in one of the plurality of data FIFO buffers based on a plurality of sub matching signals. The address comparing circuit sequentially stores previous addresses that accompany first commands designating the plurality of read operations and generates the plurality of sub matching signals based on a comparison of the previous addresses and a present address that accompanies a second command designating a present read operation. The control logic circuit receives the first commands and the second command and provides a read signal to the address comparing circuit in response to the first commands and the second command designating the plurality of read operations and the present read operation.

According to some example embodiments, an electronic device includes a system-on-chip (SoC), a semiconductor memory device and a display device. The SoC includes a memory controller, a display controller and a graphic processing unit (GPU) that generates a plurality of image data by rendering at least one object. The semiconductor memory device is connected to the SoC through the memory controller. The display device is connected to the SoC through the display controller. The semiconductor memory device includes a memory cell array, and a data first-in/first-out (FIFO) circuit. The memory cell array includes a plurality of volatile memory cells coupled to a plurality of word-lines and a plurality of bit-lines, and stores the plurality of image data. The data FIFO circuit includes a plurality of data FIFO buffers which sequentially store read image data that is read from the memory cell array in each of a plurality of read operations. When a second frame to be displayed in the display device includes the same image data that is in one of a predetermined range of previous frames, the semiconductor memory device provides, through the memory controller and the display controller, the display device with the plurality of image data stored in one of the plurality of data FIFO buffers.

According to some example embodiments, a semiconductor memory device includes a memory cell array, a data input/output (I/O) buffer, a data first-in/first-out (FIFO) circuit, an address comparing circuit, a control logic circuit, a first switch and a second switch. The memory cell array includes a plurality of volatile memory cells coupled to a plurality of word-lines and a plurality of bit-lines. The data I/O buffer provides the memory cell array with write data in each of a plurality of write operations. The data FIFO circuit includes plurality of data FIFO buffers which store read data read from the memory cell array in each of a plurality of first read operations. The data FIFO circuit outputs data stored in one of the plurality of data FIFO buffers based on a plurality of sub matching signals. The address comparing circuit sequentially stores first addresses accompanied by first commands designating the plurality of first read operations and generates the plurality of sub matching signals based on a comparison of the first addresses and a second address accompanied by a second command designating a second read operation. The control logic circuit receives the first commands and the second command and provides a read signal to the address comparing circuit in response to the first commands and the second command designating the plurality of first read operations and the second read operation. The first switch is connected between an address buffer, which receives the first addresses and the second address, and a column decoder coupled to the plurality of bit-lines. The second switch is connected between the data FIFO circuit and an I/O gating circuit connected to the memory cell array. In response to one of the plurality of sub matching signals indicating that the current address matches one of the plurality of previous addresses, the address comparing circuit turns off the first switch and the second switch by applying a switching control signal to the first switch and the second switch. In response to the one of the plurality of sub matching signals indicating the match, a data FIFO buffer from the plurality of data FIFO buffers that is associated with the first address that matches the second address provides the data I/O buffer with data stored therein.

Accordingly, when a same address associated with a same data is input to the address comparing circuit, the address comparing circuit and the data FIFO circuit may output the same data from one of the data FIFO buffers instead of reading and outputting the same data from the memory cell array, thereby reducing current consumption associated with a read operation.

BRIEF DESCRIPTION OF THE DRAWINGS

Some example embodiments will be described below in more detail with reference to the accompanying drawings.

DETAILED DESCRIPTION

Various example embodiments will be described more fully hereinafter with reference to the accompanying drawings, in which example embodiments are shown.

Figure 1:
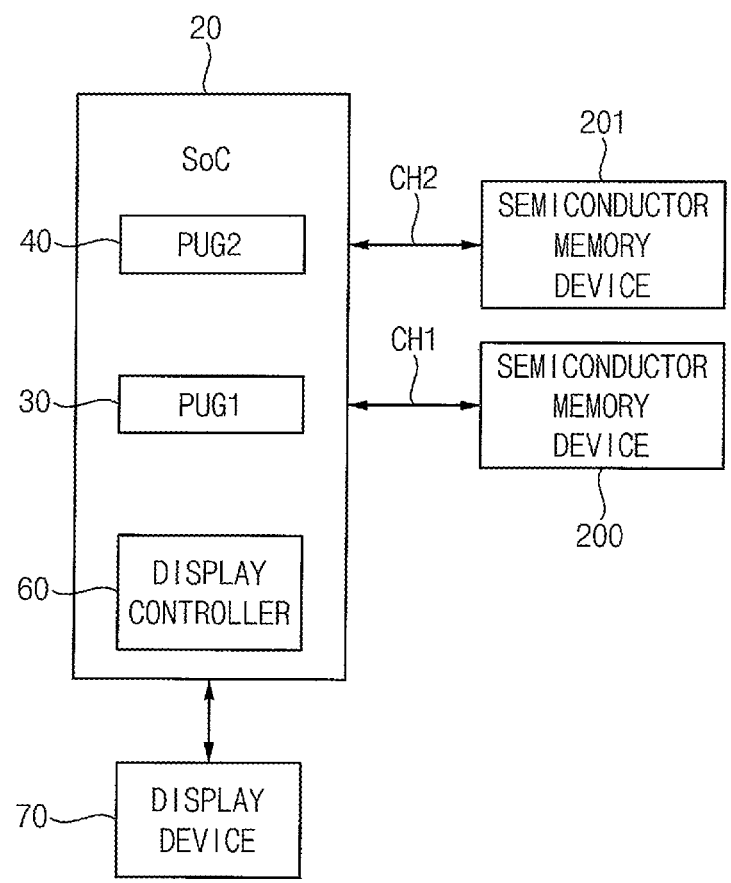
FIG. 1 is a block diagram illustrating an electronic device according to some example embodiments.

FIG. 1 is a block diagram illustrating an electronic device according to some example embodiments.

Referring to FIG. 1, an electronic device 10 may include a system-on-chip (SoC) 20, a first semiconductor memory device 200, a second semiconductor memory device 201 and a display device 70.

The SoC 20 may be an application processor (AP), and/or may include intellectual property (IP) blocks that perform or are configured to perform various operations for various applications that are supported by the electronic device 10, such as virtual reality (VR), augmented reality (AR), mixed reality (MR), or the like. The IP blocks may be implemented in the form of hardware in the SoC 20. For example, the SoC 20 may include a first processing unit group PUG1 30, a second processing unit group PUG2, and a display controller 60. The number of processing unit groups shown in FIG. 1 is only one example, and the present disclosure is not limited thereto.

In some embodiments, the second processing unit group 40 may include processing units that communicate with a general-purpose dynamic random access memory (DRAM), such as a double data rate synchronous dynamic random access memory (DDR SDRAM), DDR2 SDRAM, DDR3 SDRAM, DDR4 SDRAM, DDR5 SDRAM, LPDDR (low power double data rate) SDRAM, LPDDR2 SDRAM, LPDDR3 SDRAM, LPDDR4 SDRAM, LPDDR4X SDRAM, LPDDR5 SDRAM, or the like. For example, the second processing unit group 40 may include at least one of a central processing unit (CPU), an image signal processing unit (ISP), and/or a digital signal processing unit (DSP).

The first processing unit group 30 may support applications different from applications that are supported by the second processing unit group 40. For example, the amount of computation needed for an application supported by the first processing unit group 30 may be greater than the amount of computation needed for an application supported by the second processing unit group 40. That is, the first processing unit group 30 may include processing units that communicate with a high-performance DRAM, the bandwidth of which is higher than a bandwidth of the general-purpose DRAM. Examples of such a high-performance DRAM include a graphics double data rate (GDDR) synchronous graphics random access memory (SGRAM), GDDR2 S GRAM, GDDR3 S GRAM, GDDR4 S GRAM, GDDR5 S GRAM, GDDR6 SGRAM, a high bandwidth memory (HBM), HBM2, HBM3, or the like.

In some embodiments, the first processing unit group 30 may include at least one of a graphics processing unit (GPU), a vision processing unit (VPU), and/or a neural processing unit (NPU).

The first processing unit group 30 may communicate with the first semiconductor memory device 200 through a first channel CH1, and the second processing unit group 40 may communicate with the second semiconductor memory device 201 through a second channel CH2. The first processing unit group 30 may be connected to the display device 70 through the display controller 60.

Characteristics of first data input/output (I/O) between the first processing unit group 30 and the first semiconductor memory device 200 through the first channel CH1 may be different from characteristics of second data I/O between the second processing unit group 40 and the second semiconductor memory device 201 through the second channel CH2. For example, a transmission speed (or a transmission rate) of the first channel CH1 may be different from a transmission speed of the second channel CH2, and/or a bandwidth of the first channel CH1 may be different from a bandwidth of the second channel CH2. In some embodiments, the bandwidth of the first data I/O may be higher than the bandwidth of the second data I/O. The bandwidth may increase as the number of I/O pins assigned to a channel increases or a transmission speed of each I/O pin becomes higher.

A GPU or other processor/processing unit of the first processing unit group 30 may generate a plurality of image data by rendering at least one object and may store the plurality of image data in the first semiconductor memory device 200. The first semiconductor memory device 200 may store the plurality of image data. When an image to be displayed in the display device 70 in a current or present frame is the same as one in a predetermined range of previous frames, the first semiconductor memory device 200 may provide the display device 70 with the plurality of image data, via the display controller 60. The first semiconductor memory device 200 may store the plurality of image data in one of a plurality of data first-in/first-out (FIFO) buffers therein (not shown in FIG. 1).

The display device 70 may be implemented as a device configured to output or capable of outputting a visible image, and may display final images provided by the GPU or other processing unit. For example, the display device 70 may be implemented as a liquid crystal display (LCD), a light-emitting diode (LED) display, an organic LED display, an active-matrix OLED (AMOLED) display, an electrochromic device (ECD), a digital mirror device (DMD), an actuated mirror device (AMD), a grating light valve (GLV), a plasma display panel (PDP), an electro-luminescent display (ELD), a vacuum fluorescent display (VFD), or the like. The display device 70 may be in a form of a flat panel display, a curved display, a flexible display, or the like.

Figure 2:
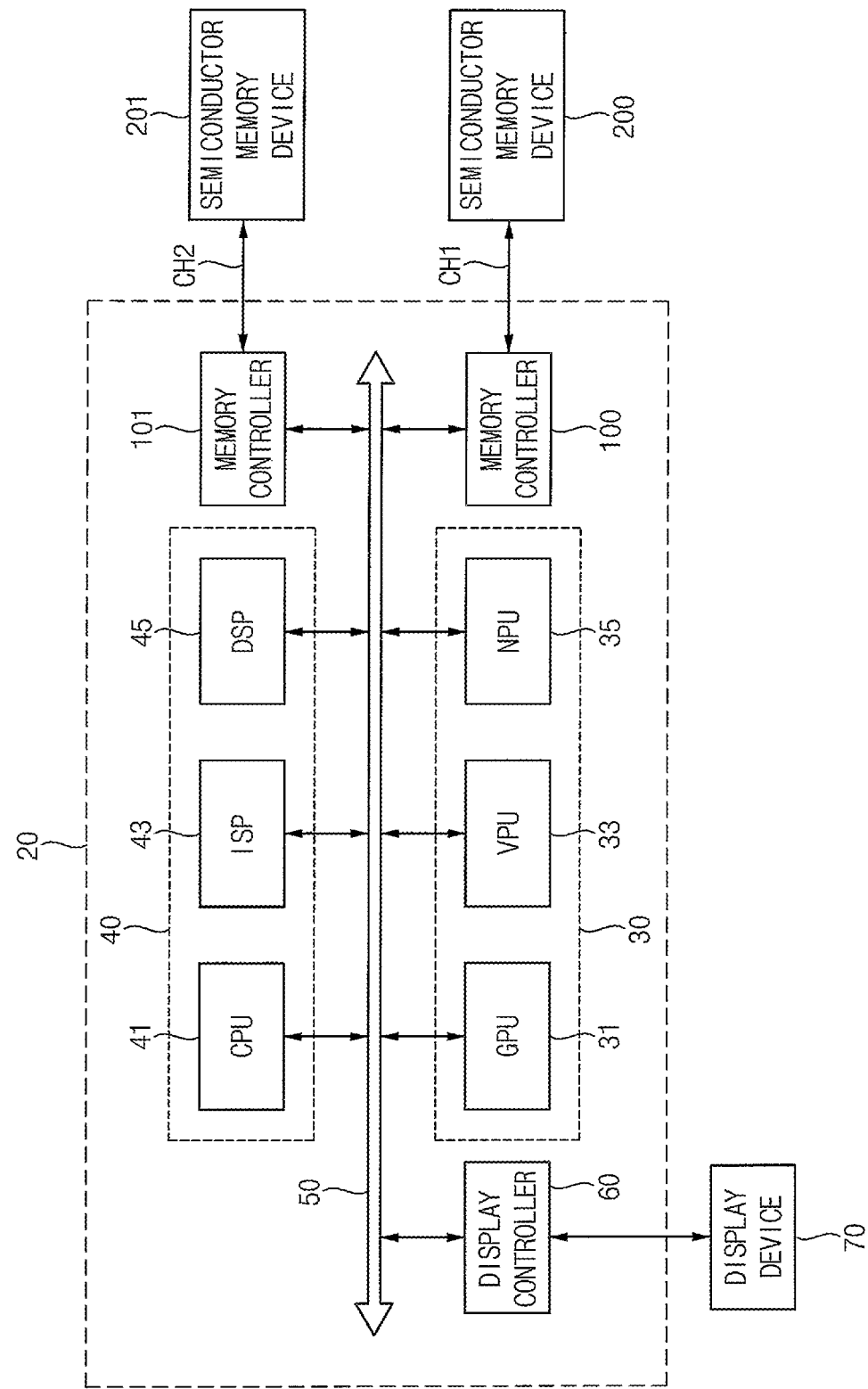
FIG. 2 is a block diagram illustrating an electronic device of FIG. 1 according to some example embodiments.

FIG. 2 is a block diagram illustrating an electronic device 10 of FIG. 1 in greater detail according some to example embodiments.

Referring to FIG. 2, the SoC 20 may include the first processing unit group 30, the second processing unit group 40, a first memory controller 100, a second memory controller 101, the display controller 60 and a bus 50.

The first processing unit group 30 may include a GPU 31, a VPU 33, and an NPU 35. The GPU 31 may be a graphics processing dedicated processor for improving graphic performance. The VPU 33 may be a processor for executing machine vision algorithms such as convolution neural networks (CNN), scale-invariant feature transform (SIFT), and/or or the like. The NPU 35 may be a processor for implementing an artificial neural network. In some embodiments, and in contrast to the illustration of FIG. 2, the first processing unit group 30 may include only a subset of the GPU 31, the VPU 33, and the NPU 35, and/or may include a different dedicated processor intended for only a specific purpose or subset of purposes.

The second processing unit group 40 may include a CPU 41, an ISP 43, and a DSP 45. The CPU 41 may include one or more cores (e.g., a multi-core), which may be homogeneous processor cores or heterogeneous processor cores. The cores may operate independently of each other. The ISP 43 may be a processor used to recognize and analyze an image. The DSP 45 may be a processor that processes a digital signal at high speed for reducing the load of the CPU 41. In some embodiments, and in contrast to the illustration of FIG. 2, the second processing unit group 40 may include only a subset of the CPU 41, the ISP 43, and the DSP 45, and/or may further include another processor.

The first memory controller 100 may provide an interface via which communication through the first channel CH1 may be performed. The first memory controller 100 may transmit data provided by the first processing unit group 30 to the first semiconductor memory device 200 and/or may transmit data provided from the first semiconductor memory device 200 to the first processing unit group 30.

The second memory controller 101 may provide an interface via which communication through the second channel CH2 may be performed. The second memory controller 101 may transmit data provided by the second processing unit group 40 to the second semiconductor memory device 201 and/or may transmit data provided from the second semiconductor memory device 201 to the second processing unit group 40.

The bus 50 may provide a data input/output path between the first processing unit group 30, the second processing unit group 40, the first memory controller 100, the second memory controller 101, and the display controller 60. For example, the bus 50 may be implemented with an advanced microcontroller bus architecture (AMBA), an advanced high-performance bus (AHB), an advanced peripheral bus (APB), an advanced eXtensible interface (AXI), an advanced system bus (ASB), or AXI coherency extensions (ACE), or a combination thereof, but the bus 50 may not be limited thereto.

Figure 3:
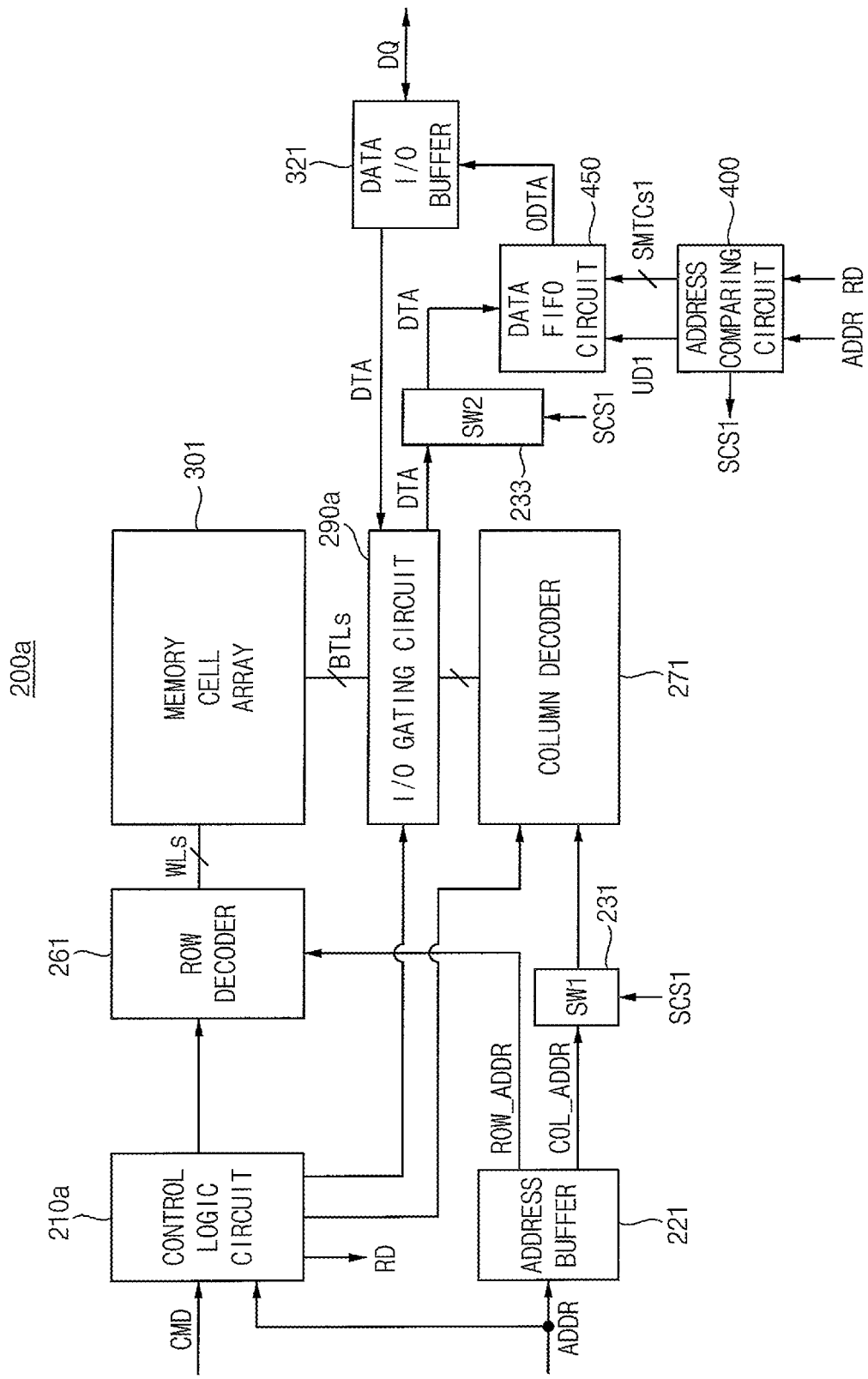
FIG. 3 is a block diagram illustrating an example of the first semiconductor memory device in the electronic device of FIG. 2 according to some example embodiments.

FIG. 3 is a block diagram illustrating an example of the first semiconductor memory device in the electronic device of FIG. 2 according to some example embodiments.

Referring to FIG. 3, a first semiconductor memory device 200a may include a control logic circuit 210a, an address buffer 221, a column decoder 271, a row decoder 261, an input/output (I/O) gating circuit 290a, a data I/O buffer 321, a memory cell array 301, an address comparing circuit 400, a data FIFO circuit 450, a first switch SW1 231 and a second switch SW2 233. The first semiconductor memory device 200a may be referred to as a semiconductor memory device.

The control logic circuit 210a may receive a command CMD and an access address ADDR. The control logic circuit 210a may control operation of the semiconductor memory device 200a based on the command CMD the access address ADDR. The control logic circuit 210a may control the row decoder 261, the I/O gating circuit 290a, and the column decoder 271 based on the command CMD the access address ADDR. The control logic circuit 210a may provide a read signal RD to the address comparing circuit 400 in response to the command CMD designating a read operation.

The address buffer 221 may receive the access address ADDR, may provide a row address ROW_ADDR of the access address ADDR to the row decoder 261 and may provide a column address COL_ADDR of the access address ADDR to the column decoder 271 through the first switch 231.

The row decoder 261 may be coupled to the memory cell array 301 through word-lines WLs, and the I/O gating circuit 290a may be coupled to the memory cell array 301 through bit-lines BTLs. The I/O gating circuit 290a may be coupled to the column decoder 271. The data I/O buffer 321 may receive/transmit data signal DQ with the first memory controller 100.

The first switch 231 may selectively provide the column address COL_ADDR to the column decoder 271 in response to a switching control signal SCS1 in a read operation. The first switch 231 may selectively connect the address buffer 221 to the column decoder 271 in a read operation.

The data I/O buffer 321 may store data DTA based on the data signal DQ in a target page of the memory cell array 301 through the I/O gating circuit 290a in a write operation. The data I/O buffer 321 may provide (via the I/O gating circuit 290a) the memory cell array 301 write data received from an outside or external source (e.g., the first memory controller 100) in each of a plurality of write operations.

The second switch 233 may selectively provide the data DTA read from the memory cell array 301 (through the I/O gating circuit 290a) to the data FIFO circuit 450 in response to the switching control signal SCS1 in the read operation.

The address comparing circuit 400 may generate a plurality of sub matching signals SMTCs1 and an updating signal UD1 based on the access address ADDR and the read signal RD. The address comparing circuit 400 may sequentially store previous addresses accompanied by first commands designating a plurality of read operations, and may generate the plurality of sub matching signals SMTCs1 and the updating signal UD1 based on a comparison of a current or present address accompanied by a second command designating a current or present read operation and the previous addresses. The address comparing circuit 400 may generate the switching control signal SCS1 based on the comparison of the current or present address and the previous addresses.

The address comparing circuit 400 may provide the plurality of sub matching signals SMTCs1 and the updating signal UD1 to the data FIFO circuit 450, and may provide the switching control signal SCS1 to the first switch 231 and the second switch 233.

The data FIFO circuit 450 may include a plurality of data FIFO buffers that store read data that is read from the memory cell array 301 in each of the plurality of read operations, based on FIFO scheme. When the second switch 233 is turned off (i.e., opened) in response to the switching control signal SCS1, one of data stored in the plurality of data FIFO buffers may be provided to the data I/O buffer 321 as an output data ODTA in response to the plurality of sub matching signals SMTCs1, and the data I/O buffer 321 may provide the first memory controller 100 with the data signal DQ based on the output data ODTA.

When the second switch 233 is turned on (i.e., closed) in response to the switching control signal SCS1, data read from the memory cell array 301 may be provided to the data I/O buffer 321 as an output data ODTA.

Figure 4:
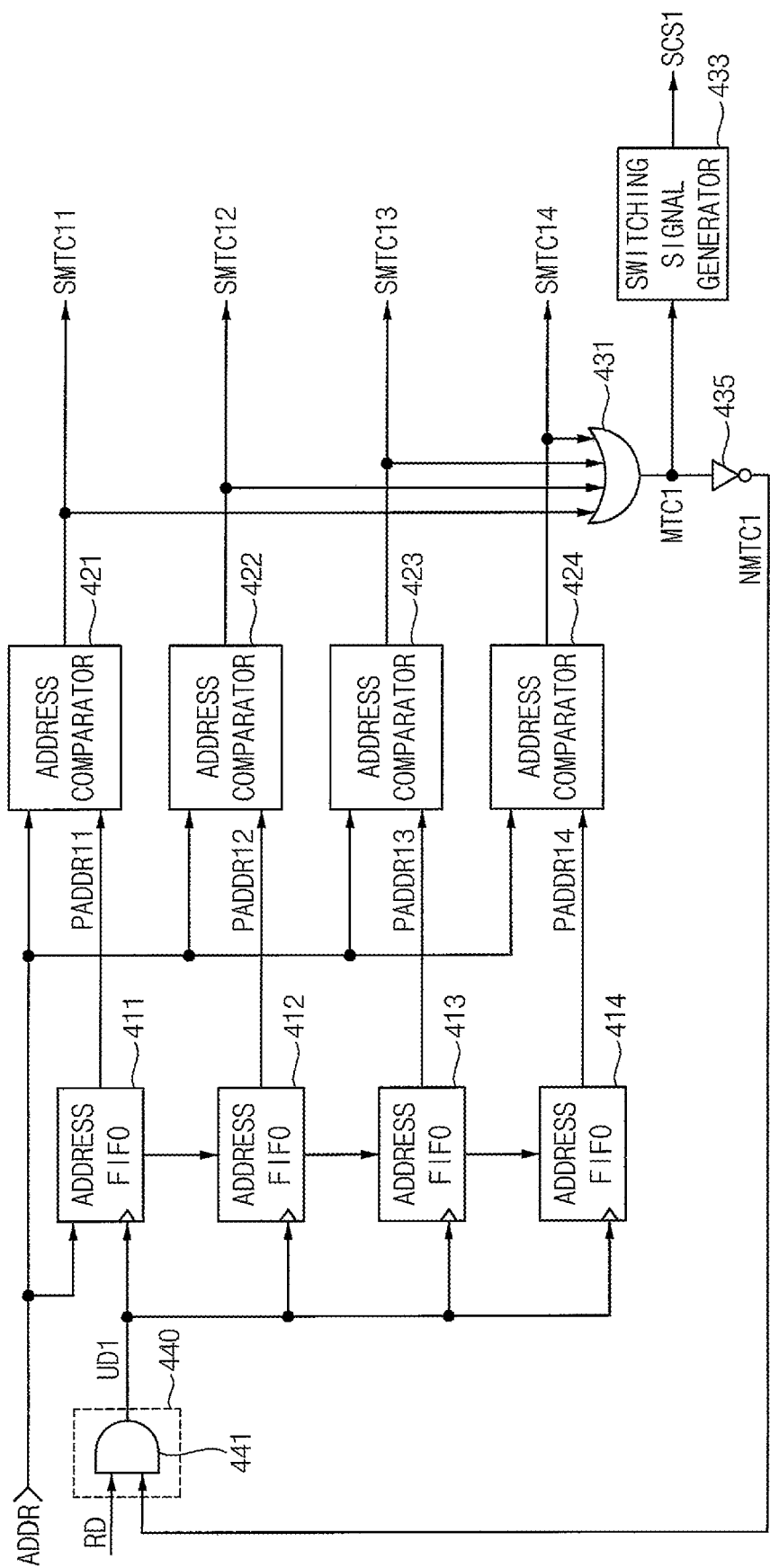
FIG. 4 is a block diagram illustrating an example of the address comparing circuit in the semiconductor memory device of FIG. 3 according to some example embodiments.

FIG. 4 is a block diagram illustrating an example of the address comparing circuit in the semiconductor memory device of FIG. 3 according to some example embodiments.

Referring to FIG. 4, the address comparing circuit 400 may include a plurality of address FIFO buffers 411, 412, 413 and 414, a plurality of address comparators 421, 422, 423 and 424, an OR gate 431, an inverter 435, a switching signal generator 433 and an updating signal generator 440.

The plurality of address FIFO buffers 411, 412, 413 and 414 may store, in a FIFO scheme or manner, a plurality of addresses accompanied by the plurality of read operations in response to the plurality of addresses not matching one another. The plurality of address comparators 421, 422, 423 and 424 may compare a current or present address ADDR that is currently or presently accessed with respective one of the plurality of previous addresses PADDR11, PADDR12, PADDR13 and PADDR14 stored in the plurality of address FIFO buffers 411, 412, 413 and 414 and generate a plurality of sub matching signals SMTC11, SMTC12, SMTC13 and SMTC14, respectively.

The OR gate 431 may perform an OR operation on the plurality of sub matching signals SMTC11, SMTC12, SMTC13 and SMTC14 and may generate a matching signal MTC1. When the current or present address ADDR matches one of the previous addresses PADDR11, PADDR12, PADDR13 and PADDR14, one of the sub matching signals SMTC11, SMTC12, SMTC13 and SMTC14 may have a first logic level (i.e., a logic high level) and the OR gate 431 may output the matching signal MTC1 having a first logic level.

The switching signal generator 433 may generate the switching control signal SCS1 that is applied to the first switch 231 and the second switch 233, based on the matching signal MTC1. The switching signal generator 433 may generate the switching control signal SCS1 that turns off (and opens) the first switch 231 and the second switch 233, based on the matching signal MTC1 having the first logic level. In other words, if the current or present address ADDR matches one of the previous addresses PADDR11, PADDR12, PADDR13 and PADDR14, then the switching signal generator 433 may generate the switching control signal SCS1 that turns off (and opens) the first switch 231 and the second switch 233, thereby disconnecting the column decoder 271 from the address buffer 221 and disconnecting the I/O gating circuit 290a from the data FIFO circuit 450. The switching signal generator 433 may generate the switching control signal SCS1 that turns on the first switch 231 and the second switch 233, based on the matching signal MTC1 having a second logic level (i.e., a logic low level). In other words, if the current or present address ADDR does not match one of the previous addresses PADDR11, PADDR12, PADDR13 and PADDR14, then the switching signal generator 433 may generate the switching control signal SCS1 that turns on (and closes) the first switch 231 and the second switch 233, thereby connecting the column decoder 271 to the address buffer 221 and connecting the I/O gating circuit 290a to the data FIFO circuit 450.

The inverter 435 may invert the matching signal MTC1 and may generate a no matching signal NMTC1 and may provide the no matching signal NMTC1 to the updating signal generator 440.

The updating signal generator 440 may generate the updating signal UD1 based on the no matching signal NMTC1 and the read signal RD and may provide the updating signal UD1 to the address FIFO buffers 411, 412, 413 and 414. The updating signal generator 440 may include an AND gate 441 that outputs the updating signal UD1 by performing an AND operation on the no matching signal NMTC1 and the read signal RD.

Therefore, the updating signal generator 440 may output the updating signal UD1 having a first logic level when the read signal RD has a first logic level and the no matching signal NMTC1 has a first logic level. The updating signal generator 440 may output the updating signal UD1 having the first logic level when respective one of the sub matching signals SMTC11, SMTC12, SMTC13 and SMTC14 has a second logic level because the current or present address ADDR does not match a respective one of the previous addresses PADDR11, PADDR12, PADDR13 and PADDR14.

Each of the address FIFO buffers 411, 412 and 413 may shift respective one of the previous addresses PADDR11, PADDR12 and PADDR13 stored therein to each of the address FIFO buffers 412, 413 and 414, in response to a rising edge of the updating signal UD1.

Figure 5:
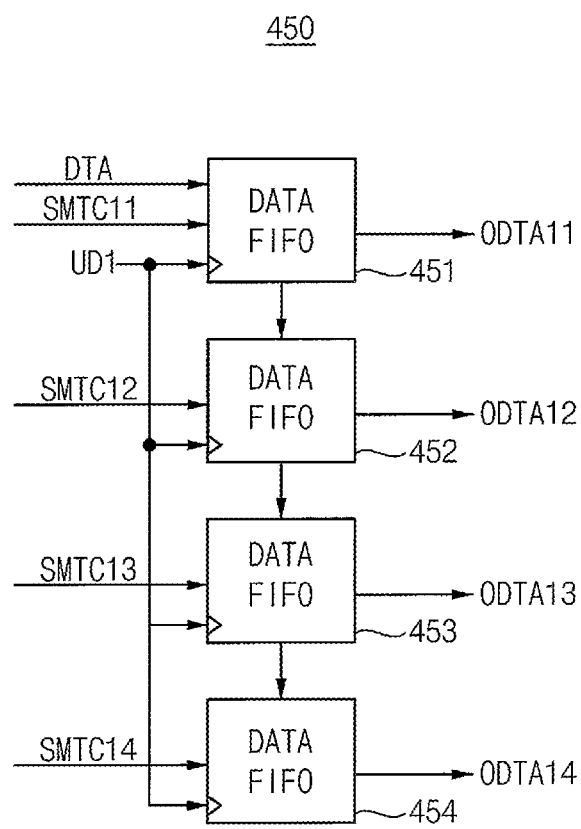
FIG. 5 is a block diagram illustrating an example of the data FIFO circuit in the semiconductor memory device of FIG. 3 according to some example embodiments.

FIG. 5 is a block diagram illustrating an example of the data FIFO circuit in the semiconductor memory device of FIG. 3 according to example embodiments.

Referring to FIG. 5, the data FIFO circuit 450 may include a plurality of data FIFO buffers 451, 452, 453 and 454.

The plurality of data FIFO buffers 451, 452, 453 and 454 may store different data that is read from the memory cell array 301 in each of a plurality of read operations, based on FIFO scheme. The data DTA may be sequentially shifted to the data FIFO buffers 451, 452, 453 and 454 and may be sequentially stored in the data FIFO buffers 451, 452, 453 and 454.

Each of the data FIFO buffers 451, 452, 453 and 454 may output data stored therein to the data I/O buffer 321 as a respective one of output data ODTA11, ODTA12, ODTA13 and ODTA14 in response to corresponding one of the sub matching signals SMTC11, SMTC12, SMTC13 and SMTC14.

When one of the sub matching signals SMTC11, SMTC12, SMTC13 and SMTC14 has a first logic level, a data FIFO buffer from among the data FIFO buffers 451, 452, 453 and 454 that receives the sub matching signal having the first logic level may output data stored therein to the data I/O buffer 321 as an output data.

The data FIFO buffers 451, 452, 453 and 454 may receive the updating signal UD1. Each of the data FIFO buffers 451, 452 and 453 may shift the data stored therein to each of the data FIFO buffers 452, 453 and 454, in response to a rising edge of the updating signal UD1, when each of the sub matching signals SMTC11, SMTC12, SMTC13 and SMTC14 has a second logic level because the current or present address ADDR does not match the previous addresses PADDR11, PADDR12, PADDR13 and PADDR14.

Figure 6:
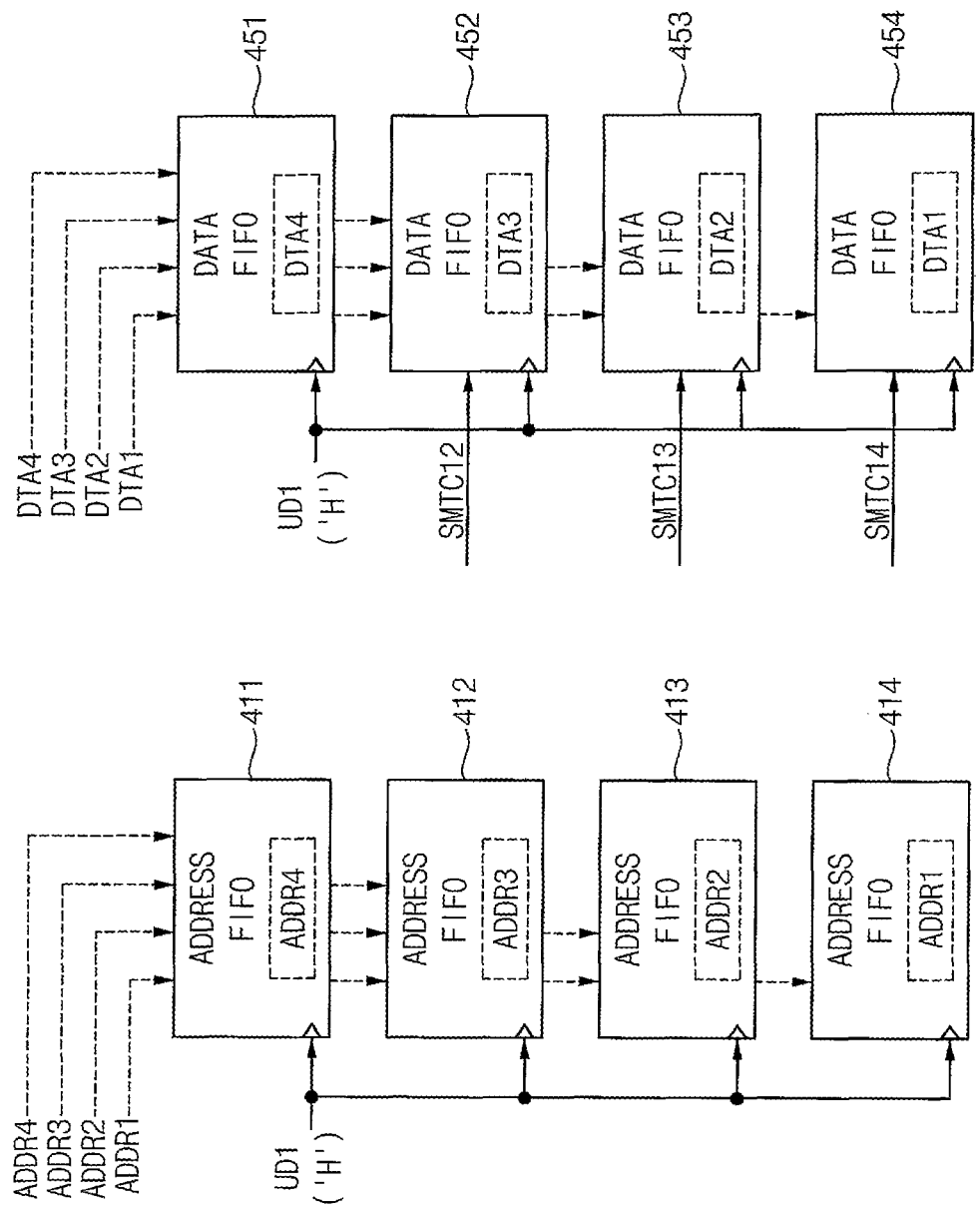
FIG. 6 illustrates operations of the address comparing circuit of FIG. 4 and the data FIFO circuit of FIG. 5 according to some example embodiments.

FIG. 6 illustrates operations of the address comparing circuit of FIG. 4 and the data FIFO circuit of FIG. 5 according to some example embodiments.

FIG. 6 illustrates an operation the address FIFO buffers 411, 412, 413 and 414 and an operation of the data FIFO buffers 451, 452, 453 and 454 when addresses ADDR1, ADDR2, ADDR3 and ADDR4 associated with a plurality of read operations are different from each other and data DTA1, DTA2, DTA3 and DTA4 associated with the plurality of read operations are different from each other.

Referring to FIGS. 4 through 6, when a first address ADDR1 associated with a first read operation is input to the address comparing circuit 400, the first address ADDR1 is stored in the address FIFO buffer 411 (i.e., a first address FIFO buffer) and a first data DTA1 associated with the first read operation is stored in the data FIFO buffer 451 (i.e., a first data FIFO buffer).

When a second address ADDR2 associated with a second read operation is input to the address comparing circuit 400 after the first read operation, the address comparator 421 (i.e., a first address comparator) compares the second address ADDR2 with the first address ADDR1 stored in the address FIFO buffer 411 as a previous address PADDR11 and outputs the sub matching signal SMTC11 having a second logic level. Because each of the sub matching signals SMTC11, SMTC12, SMTC13 and SMTC14 has a second logic level as denoted by the updating signal UD1 has a first logic level as denoted by 'H'. The address FIFO buffer 411 shifts the first address ADDR1 stored therein to the address FIFO buffer 412 (i.e., a second address FIFO buffer) in response to a rising edge of the updating signal UD1 and stores the second address ADDR2. The data FIFO buffer 451 shifts the first data DTA1 stored therein to the data FIFO buffer 452 (i.e., a second data FIFO buffer) in response to a rising edge of the updating signal UD1 and stores the second data DTA2.

When a third address ADDR3 associated with a third read operation is input to the address comparing circuit 400 after the second read operation, the address comparator 421 compares the third address ADDR3 with the second address ADDR2 stored in the address FIFO buffer 411 as a previous address PADDR11 and outputs the sub matching signal SMTC11 having a second logic level. The address comparator 422 (i.e., a second address comparator) compares the third address ADDR3 with the first address ADDR1 stored in the address FIFO buffer 412 as a previous address PADDR12 and outputs the sub matching signal SMTC12 having a second logic level.

Because each of the sub matching signals SMTC11, SMTC12, SMTC13 and SMTC14 has a second logic level, the updating signal UD1 has a first logic level. The address FIFO buffer 411 shifts the second address ADDR2 stored therein to the address FIFO buffer 412 in response to a rising edge of the updating signal UD1 and stores the third address ADDR3. The address FIFO buffer 412 shifts the first address ADDR1 stored therein to the address FIFO buffer 413 (a third address FIFO buffer) in response to a rising edge of the updating signal UD1 and stores the second address ADDR2. The data FIFO buffer 451 shifts the second data DTA2 stored therein to the data FIFO buffer 452 in response to a rising edge of the updating signal UD1 and stores the third data DTA3. The data FIFO buffer 452 shifts the first data DTA1 stored therein to the data FIFO buffer 453 (i.e., a third data FIFO buffer) in response to a rising edge of the updating signal UD1 and stores the second data DTA2.

When a fourth address ADDR4 associated with a fourth read operation is input to the address comparing circuit 400 after the third read operation, the address comparator 421 compares the fourth address ADDR4 with the third address ADDR3 stored in the address FIFO buffer 411 as the previous address PADDR11 and outputs the sub matching signal SMTC11 having a second logic level. The address comparator 422 compares the fourth address ADDR4 with the second address ADDR2 stored in the address FIFO buffer 412 as the previous address PADDR12 and outputs the sub matching signal SMTC12 having a second logic level. The address comparator 423 (i.e., a third address comparator) compares the fourth address ADDR4 with the first address ADDR1 stored in the address FIFO buffer 413 as a previous address PADDR13 and outputs the sub matching signal SMTC13 having a second logic level.

Because each of the sub matching signals SMTC11, SMTC12, SMTC13 and SMTC14 has a second logic level, the updating signal UD1 has a first logic level. The address FIFO buffer 411 shifts the third address ADDR3 stored therein to the address FIFO buffer 412 in response to a rising edge of the updating signal UD1 and stores the fourth address ADDR4. The address FIFO buffer 412 shifts the second address ADDR2 stored therein to the address FIFO buffer 413 in response to a rising edge of the updating signal UD1 and stores the third address ADDR3. The address FIFO buffer 413 shifts the first address ADDR1 stored therein to the address FIFO buffer 414 (i.e., a fourth address FIFO buffer) in response to a rising edge of the updating signal UD1 and stores the second address ADDR2.

The data FIFO buffer 451 shifts the third data DTA3 stored therein to the data FIFO buffer 452 in response to a rising edge of the updating signal UD1 and stores the fourth data DTA4. The data FIFO buffer 452 shifts the second data DTA2 stored therein to the data FIFO buffer 453 in response to a rising edge of the updating signal UD1 and stores the third data DTA3. The data FIFO buffer 453 shifts the first data DTA1 stored therein to the data FIFO buffer 454 (i.e., a fourth data FIFO buffer) in response to a rising edge of the updating signal UD1 and stores the second data DTA2.

Figure 7:
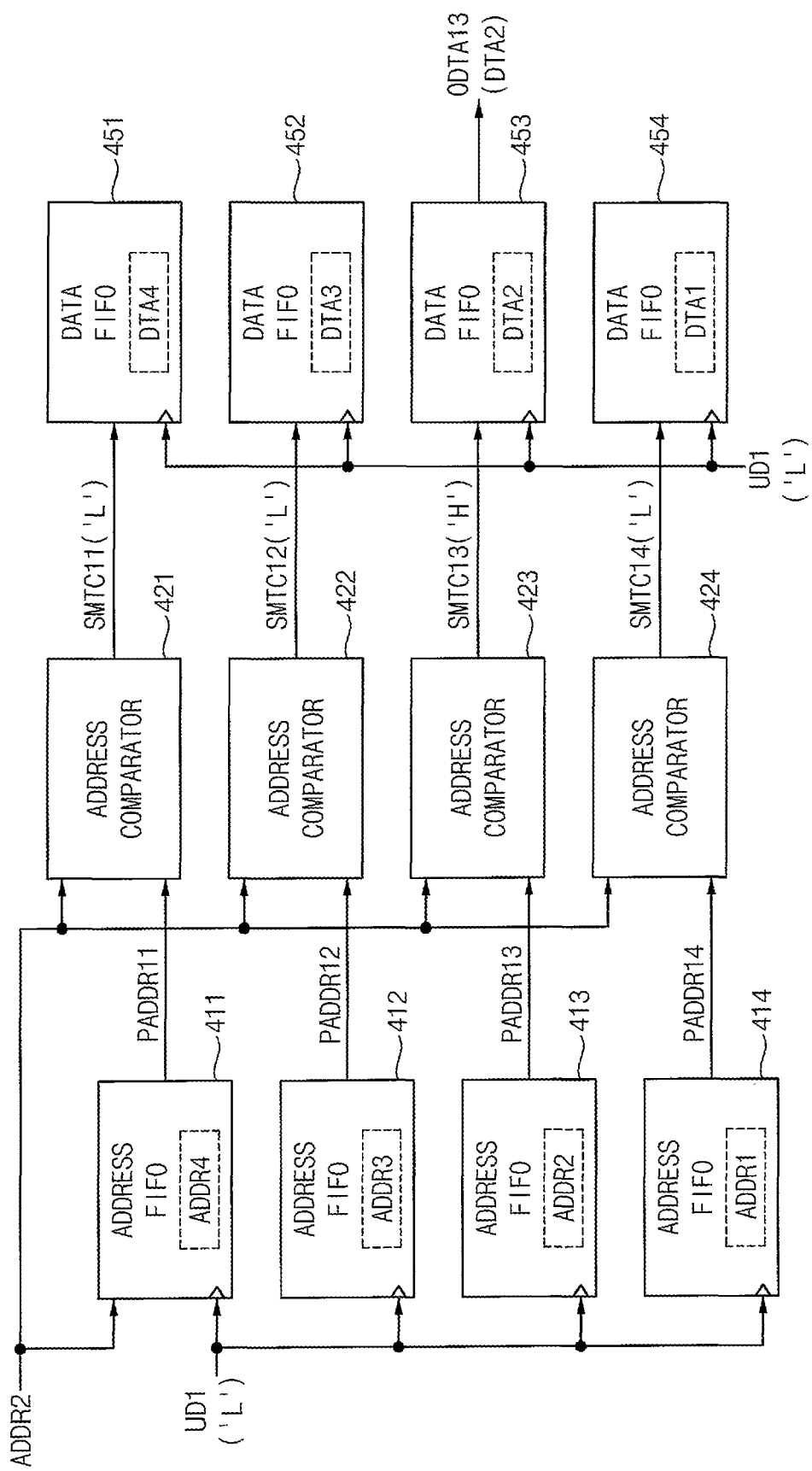
FIG. 7 illustrates operations of the address comparing circuit of FIG. 4 and the data FIFO circuit of FIG. 5 according to some example embodiments.

FIG. 7 illustrates operations of the address comparing circuit of FIG. 4 and the data FIFO circuit of FIG. 5 according to example embodiments.

In FIG. 7, it is assumed that the address ADDR2 is input to the address comparing circuit 400 after different addresses ADDR1, ADDR2, ADDR3 and ADDR4 are input to the address comparing circuit 400 and different data DTA1, DTA2, DTA3 and DTA4 are input to the data FIFO circuit 450.

Referring to FIGS. 4 and 7, when the current or present address ADDR2 associated with a fifth read operation is input to the address comparing circuit 400 after different previous addresses ADDR1, ADDR2, ADDR3 and ADDR4 are input to the address comparing circuit 400 and different data DTA1, DTA2, DTA3 and DTA4 are input to the data FIFO circuit 450, the address comparator 421 compares the current or present address ADDR2 with the fourth address ADDR4 stored in the address FIFO buffer 411 as the previous address PADDR11 and outputs the sub matching signal SMTC11 having a second logic level. The address comparator 422 compares the current or present address ADDR2 with the third address ADDR3 stored in the address FIFO buffer 412 as the previous address PADDR12 and outputs the sub matching signal SMTC12 having a second logic level. The address comparator 423 compares the current or present address ADDR2 stored in the address FIFO buffer 413 as the previous address PADDR13 and outputs the sub matching signal SMTC13 having a first logic level as denoted by 'H'. The address comparator 424 compares the current or present address ADDR2 with the first address ADDR1 stored in the address FIFO buffer 414 as the previous address PADDR14 and outputs the sub matching signal SMTC14 having a second logic level.

The data FIFO buffer 453 provides the data I/O buffer 321 with the second data DTA2 stored therein as an output data ODTA13 in response to the sub matching signal SMTC13 having a first logic level.

Because the sub matching signal SMTC13 has a first logic level, the updating signal UD1 has a second logic level and the matching signal MTC1 has a first logic level.

The switching signal generator 433 generates the switching control signal SCS1 to turn off (open) the first switch 231 and the second switch 241 in response to the matching signal MTC1 having a first logic level. In response to the updating signal UD1 having a second logic level, each of the address FIFO buffers 411, 412, 413 and 414 maintains an address stored therein and each of the data FIFO buffers 451, 452, 453 and 454 maintains data stored therein.

Accordingly, when a same address associated with a same data is input to the address comparing circuit 400, the address comparing circuit 400 and the data FIFO circuit 450 may output the same data in one of the data FIFO buffers 451, 452, 453 and 454 instead of outputting the same data read from the memory cell array 301 to reduce current consumption associated with a read operation.

Figure 8:
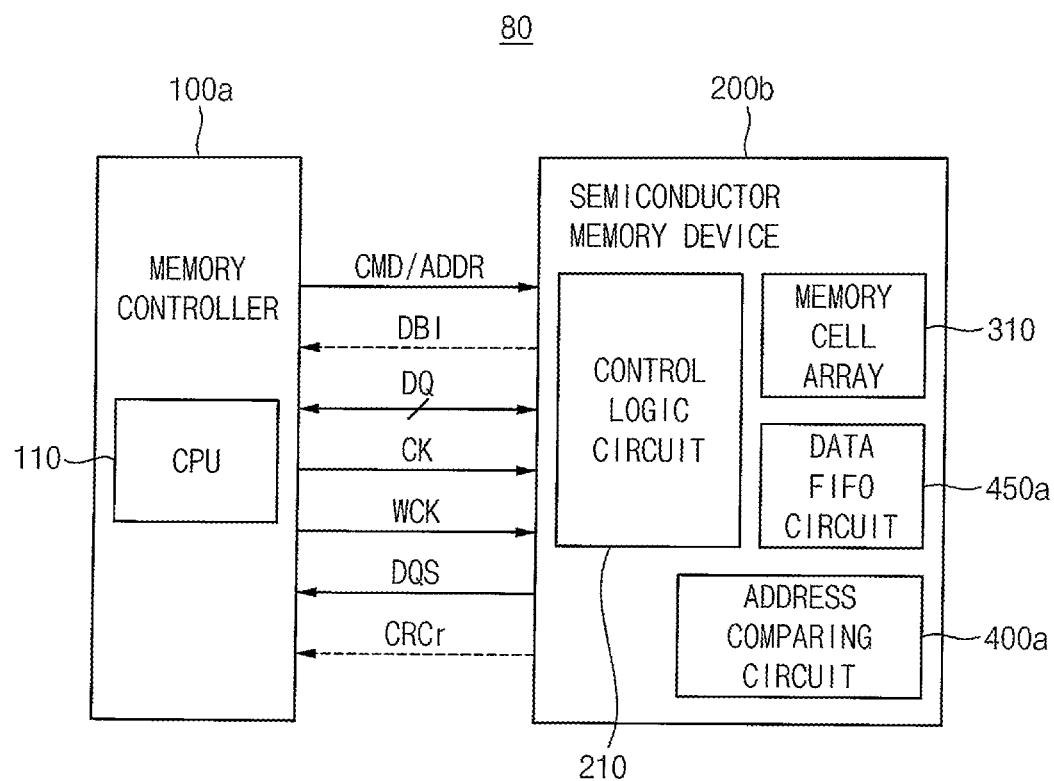
FIG. 8 is a block diagram illustrating a memory system that may include a first memory controller and a first semiconductor memory device in the electronic device of FIG. 1, according to some example embodiments.

FIG. 8 is a block diagram illustrating a memory system that may include a first memory controller and a first semiconductor memory device in the electronic device of FIG. 1, according to some example embodiments.

Referring to FIG. 8, a memory system 80 may include a memory controller 100a and a semiconductor memory device 200b.

The memory controller 100a may control overall operation of the memory system 80. The memory controller 100a may control overall data exchange between an external host and the semiconductor memory device 200b. For example, the memory controller 100a may write data in the semiconductor memory device 200b and/or read data from the semiconductor memory device 200b in response to a request from the host.

In addition, the memory controller 100a may issue operation commands to the semiconductor memory device 200b for controlling the semiconductor memory device 200b.

The memory controller 100a may transmit a clock signal CK (the clock signal CK may be referred to as a command clock signal), a command CMD, and an address (signal) ADDR to the semiconductor memory device 200b. The memory controller 100a may transmit a data clock signal WCK to the semiconductor memory device 200a when the memory controller 100 writes data signal DQ in the semiconductor memory device 200b or reads data signal DQ from the semiconductor memory device 200b. The semiconductor memory device 200b may transmit a strobe signal DQS along with the data signal DQ to the memory controller 100 when the semiconductor memory device 200b transmits the data signal DQ to the memory controller 100a.

In addition, the memory controller 100a may transmit/receive data bus inversion (DBI) bits to/from the semiconductor memory device 200b. The DBI bits may indicate whether each of a plurality of unit data included in the data signal DQ is inverted. The semiconductor memory device 200b may transmit a return error detection code bits CRCr to the memory controller 100a.

The memory controller 100a may include a CPU 110 to control overall operation of the memory system 80.

The semiconductor memory device 200b may include a memory cell array 310 that stores the data signal DQ, a control logic circuit 210, an address comparing circuit 400a and a data FIFO circuit 450a.

The control logic circuit 210 may control operations of the semiconductor memory device 200b.

The data FIFO circuit 450a may include a plurality of data FIFO buffers that store data that is read from the memory cell array 310 in each of the plurality of read operations, based on a FIFO scheme, and may output data stored in one of the plurality of data FIFO buffers in response to a plurality of sub matching signals. The address comparing circuit 400a may sequentially store previous addresses accompanied by first commands designating a plurality of read operations, and may generate the plurality of sub matching signals based on a comparison of a current or present address accompanied by a second command designating a current or present read operation and the previous addresses.

Figure 9:
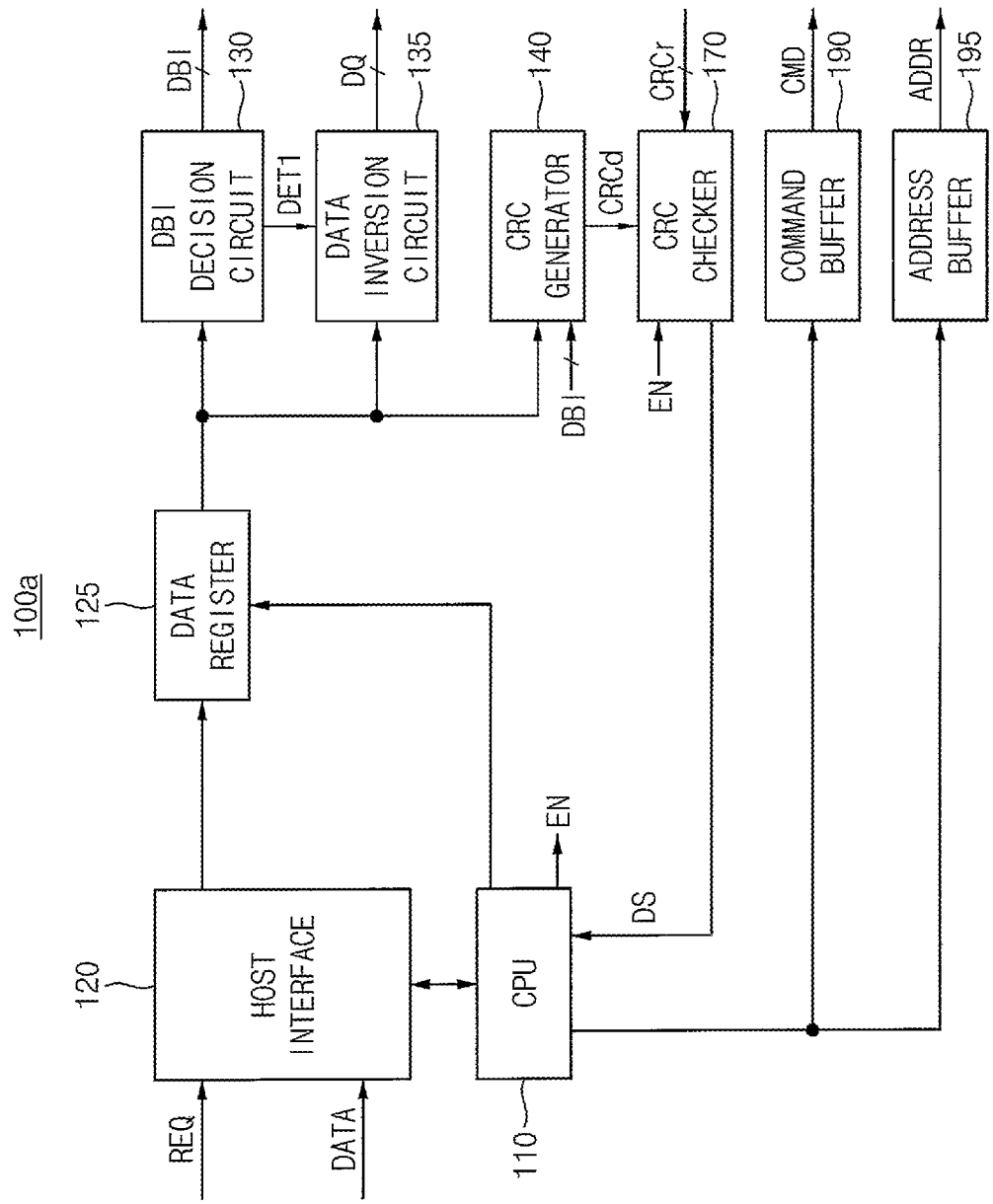
FIG. 9 is block diagram illustrating an example of the memory controller in the memory system of FIG. 8 according to some example embodiments.

FIG. 9 is block diagram illustrating an example of the memory controller in the memory system of FIG. 8 according to some example embodiments.

Referring to FIG. 9, the memory controller 100a may include the CPU 110, a host interface 120, a data register 125, a data inversion DBI decision circuit 130, a data inversion circuit 135, an error detection code CRC generator 140, an error detector (CRC CHECKER) 170, a command buffer 190 and an address buffer 195.

The host interface 120 may receive a request REQ and data DATA from the host and may provide the data DATA to the data register 125.

The data register 125 may continuously (or sequentially) output the data DATA to the data inversion decision circuit 130, the data inversion circuit 135 and the error detection code generator 140. The data DATA may include a plurality of unit data (e.g., a plurality of byte-unit data).

The data inversion decision circuit 130 may count, in each unit data of the data DATA, a number of first data bits having a first logic level, and may provide, based on the counting, a decision signal DET1 indicating whether to invert each unit data. The data inversion circuit 135 may selectively invert the unit data to output the data signal DQ in response to the decision circuit DET1.

For example, when a second logic level is a logic low level ('0'), the data inversion decision circuit 130 may output the decision signal DET1 with the second logic level to the data inversion circuit 130 when a number of the first data bits in each unit data is greater than a number of second data bits having a first logic level (e.g., '1'). When the data inversion circuit 135 receives the decision signal DET1 having the second logic level, the data inversion circuit 135 may invert data bits of corresponding unit data. The data inversion decision circuit 130 outputs the decision signal DET1 for each of the unit data as the DBI bits.

DBI is a technique for current reduction. For example, to reduce consumption of a large amount of current in transmission lines terminated with a power voltage while transmitting a low-level signal, if transmitted data includes a larger number of low-level bits than high-level bits, the data is converted to include half or fewer low-level bits than a total number of the bits, and an additional signal is transmitted indicating the data conversion.

The error detection code generator 140 may receive the data DATA and the DBI bits DBI, may generate error detection code bits CRCd based on the data DATA and the DBI bits DBI, and may provide the error detection code bits CRCd to the error detector 170.

The error detector 170 may receive the error detection code bits CRCd and the return final error detection code bits CRCr, may compare corresponding bits of the error detection code bits CRCd and the return final error detection code bits CRCr, and may provide the CPU 110 with a detection signal DS1 indicating whether the data signal DQ includes the errors based on a match (or mismatch) between the corresponding bits of the error detection code bits CRCd and the return final error detection code bits CRCr.

When the detection signal DS1 indicates that the data signal DQ includes the errors, the CPU 110 may control the data register 125 such that the data DATA and the DBI bits DBI are retransmitted to the semiconductor memory device 200a. The CPU 110 may generate an enable signal EN and may provide the enable signal EN to the error detector 170.

The command buffer 190 may store the command CMD corresponding to the request REQ and may transmit the command CMD to the semiconductor memory device 200b under control of the CPU 110. The address buffer 195 may store the address ADDR and may transmit the address ADDR to the semiconductor memory device 200b under control of the CPU 110.

The error detection code generation circuit 140 may include a first cyclic redundancy check (CRC) engine and a second CRC engine. The first CRC engine may generate first error detection code bits based on the first unit data and first DBI bits associated with the first unit data. The second CRC engine may generate second error detection code bits based on the second unit data and second DBI bits associated with the second unit data. The first CRC engine and the second CRC engine may reduce hardware overhead by using a same or common generation matrix.

Figure 10:
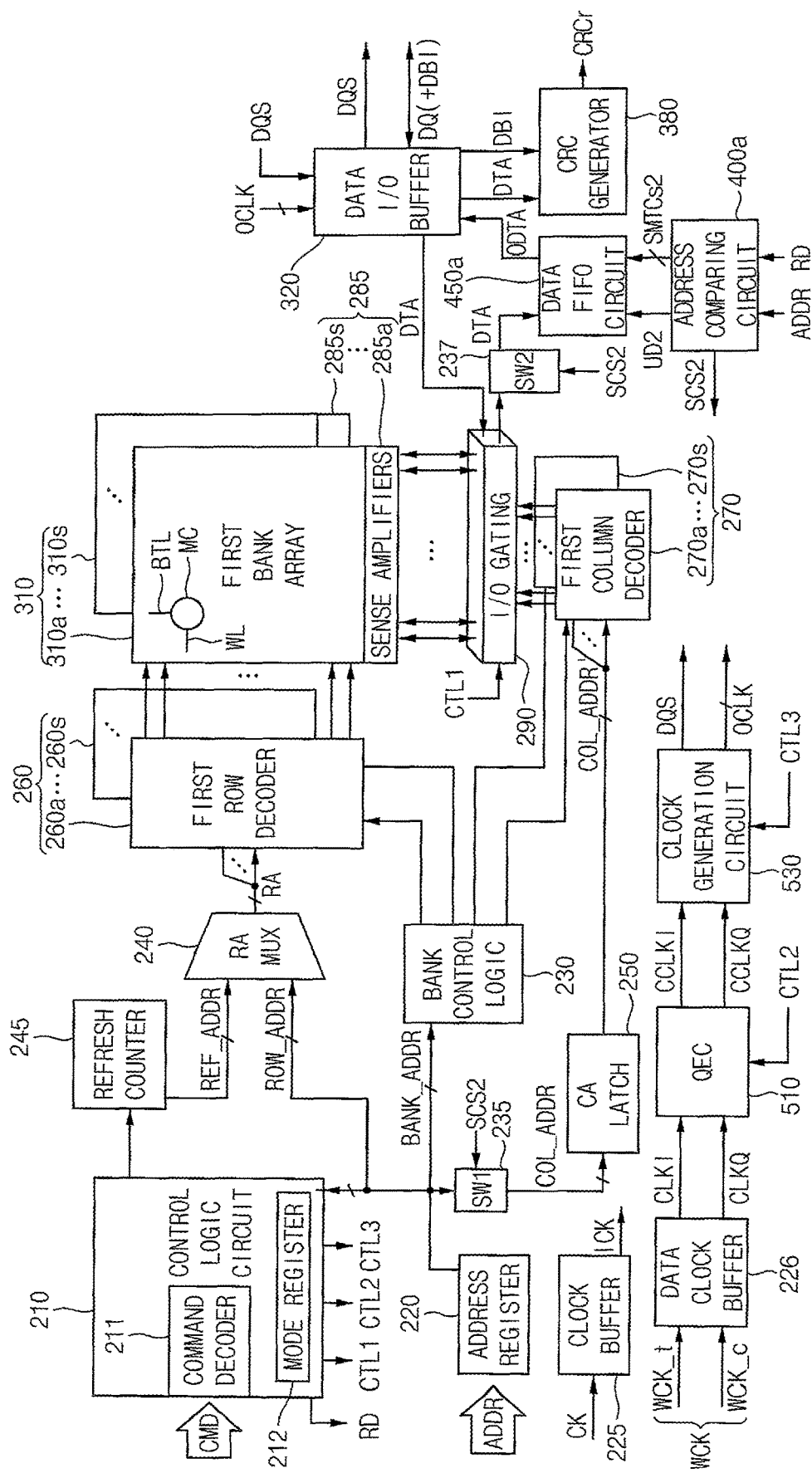
FIG. 10 is a block diagram illustrating the semiconductor memory device in the memory system of FIG. 8 according to some example embodiments.

FIG. 10 is a block diagram illustrating the semiconductor memory device in the memory system of FIG. 8 according to some example embodiments.

Referring to FIG. 10, the semiconductor memory device 200b may include the control logic circuit 210, an address register 220, a bank control logic 230, a refresh counter 245, a row address multiplexer 240, a column address CA latch 250, a row decoder 260, a column decoder 270, the memory cell array 310, a sense amplifier unit 285, an I/O gating circuit 290, a clock buffer 225, a data clock buffer 226, a quadrature error correction circuit QEC 510, a clock generation circuit 530, a data I/O buffer 320, a cyclic redundancy check (CRC) generator 380, the address comparing circuit 400a, the data FIFO circuit 450a, a first switch 235 and a second switch 237.

The memory cell array 310 may include first through sixteenth bank arrays 310a~310s. The row decoder 260 may include first through sixteenth row decoders 260a~260s respectively coupled to the first through sixteenth bank arrays 310a~310s, the column decoder 270 may include first through sixteenth column decoders 270a~270s respectively coupled to the first through sixteenth bank arrays 310a~310s, and the sense amplifier unit 285 may include first through sixteenth sense amplifiers 285a~285s respectively coupled to the first through sixteenth bank arrays 310a~310s.

The first through sixteenth bank arrays 310a~310s, the first through sixteenth row decoders 260a~260s, the first through sixteenth column decoders 270a~270s and first through sixteenth sense amplifiers 285a~285s may form first through sixteenth banks. Each of the first through sixteenth bank arrays 310a~310s may include a plurality of memory cells MC formed at intersections of a plurality of word-lines WL and a plurality of bit-lines BTL. Although FIG. 10 is shown and described herein with sixteen bank arrays 310a~310s, sixteen row decoders 260a~260s, sixteen column decoders 270a~270s, and sixteen sense amplifiers 285a~285s, the present disclosure is not limited thereto, and other numbers of bank arrays, row decoders, column decoders and sense amplifiers may be used.

The address register 220 may receive the address ADDR including a bank address BANK_ADDR, a row address ROW_ADDR and a column address COL_ADDR from the memory controller 100a. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through sixteenth row decoders 260a~260s corresponding to the bank address BANK_ADDR may be activated in response to the bank control signals, and one of the first through sixteenth column decoders 270a~270s corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through sixteenth row decoders 260a~260s.

The refresh counter 245 may sequentially increase or decrease the refresh row address REF_ADDR under control of the control logic circuit 210.

The activated one of the first through sixteenth row decoders 260a~260s that is activated by the bank control logic 230 may decode the row address RA that is output from the row address multiplexer 240, and may activate a word-line corresponding to the row address RA. For example, the activated bank row decoder applies a word-line driving voltage to the word-line corresponding to the row address.

The column address latch 250 may receive the column address COL_ADDR from the address register 220, and may temporarily store the received column address COL_ADDR. In some embodiments, in a burst mode, the column address latch 250 may generate column addresses COL_ADDR' that increment from the received column address COL_ADDR. The column address latch 250 may apply the temporarily stored or generated column addresses COL_ADDR' to the first through sixteenth column decoders 270a~270s.

The activated one of the first through sixteenth column decoders 270a~270s may activate, through the I/O gating circuit 290, a sense amplifier 285a~285s corresponding to the bank address BANK_ADDR and the column address COL_ADDR.

The I/O gating circuit 290 may include a circuitry for gating input/output data, and may further include input data mask logic, read data latches for storing data that is output from the first through sixteenth bank arrays 310a~310s, and write drivers for writing data to the first through sixteenth bank arrays 310a~310s.

Data DTA read from one bank array of the first through sixteenth bank arrays 310a~310s may be sensed by a sense amplifier 285a~285s coupled to the one bank array from which the data is to be read, and is stored in the read data latches. The data DTA stored in the read data latches may be provided to the data FIFO circuit 450a through the second switch 237. The data FIFO circuit 450a may provide the data I/O buffer 320 with the data DTA provided from the read data latches or stored in data FIFO buffers as an output data ODTA. The data I/O buffer 320 may convert the output data ODTA into the data signal DQ based on output clock signals OCLK and may transmit the data signal DQ along with the strobe signal DQS to the memory controller 100a.

The second switch 237 may be connected between the I/O gating circuit 290 and the data FIFO circuit 450a. The second switch 237 may selectively provide the data DTA provided from the I/O gating circuit 290 to the data FIFO circuit 450a in response to a switching control signal SCS2 in the read operation.

The first switch 235 may be connected between the address register 220 and the column address latch 250. The first switch 235 may selectively provide the column address COL_ADDR to the column address latch 250 in response to the switching control signal SCS2.

The data signal DQ to be written in one bank array of the first through sixteenth bank arrays 310a~310s may be provided to the data I/O buffer 320 from the memory controller 100a. The data I/O buffer 320 may convert the data signal DQ to the data DTA and may provide the data DTA to the I/O gating circuit 290. The I/O gating circuit 290 may write the data DTA in a sub-page in one bank array through the write drivers.

The data I/O buffer 320 may provide the data signal DQ from the memory controller 100a to the I/O gating circuit 290 by converting the data signal DQ to the data DTA in a write operation of the semiconductor memory device 200b, may convert the data DTA from the data FIFO circuit 450a to the data signal DQ based on the output clock signals OCLK from the clock generation circuit 530, and may transmit the data signal DQ and the strobe signal DQS to the memory controller 100a in a read operation of the semiconductor memory device 200b. The data I/O buffer 320 may output the data signal DQ to the outside or external source (e.g., outside of the semiconductor memory device 200b) based on the output clock signals OCLK in the read operation.

The data I/O buffer 320 may receive the DBI bits DBI from the memory controller 100a in the read operation. The data I/O buffer 320 may generate the DBI bits DBI based on the data DTA and may provide the data DTA and the DBI bits DBI in the read operation.

The CRC generator 380 may generate the return error detection code bits CRCr and may transmit the return error detection code bits CRCr to the memory controller 100a in the read operation.

The clock buffer 225 may receive the clock signal CK, may generate an internal clock signal ICK by buffering the clock signal CK, and may provide the internal clock signal ICK to circuit components processing the command CMD and the address ADDR.

The data clock buffer 226 may receive the data clock signal WCK including differential clock signal pair WCK_t and WCK_c, may generate a first clock signal CLKI and a second clock signal CLKQ which have a phase difference of 90 degrees with respect to each other, based on the data clock signal WCK and may provide the first clock signal CLKI and the second clock signal CLKQ to the quadrature error correction circuit 510.

The quadrature error correction circuit 510 may generate a first corrected clock signal CCLKI and a second corrected clock signal CCLKQ which have a phase difference of 90 degrees with respect to each other by concurrently adjusting a skew and a duty error of the first clock signal CLKI and the second clock signal CLKQ and may provide the first corrected clock signal CCLKI and the second corrected clock signal CCLKQ to the clock generation circuit 530.

The clock generation circuit 530 may generate the output clock signal OCLK and the strobe signal DQS based on the first corrected clock signal CCLKI and the second corrected clock signal CCLKQ and may provide the output clock signal OCLK and the strobe signal DQS to the data I/O buffer 320.

The address comparing circuit 400a may generate a plurality of sub matching signals SMTCs2 and an updating signal UD2 based on the access address ADDR and a read signal RD. The address comparing circuit 400a may sequentially store a plurality of previous (first) addresses accompanied by first commands designating a plurality of first read operations, and may generate the plurality of sub matching signals SMTCs2 and the updating signal UD2 based on a comparison of the previous (first) addresses with a current or present (second) address accompanied by a second command designating a current second read operation. The address comparing circuit 400a may generate the switching control signal SCS2 based on the comparison of the current address and the previous addresses.

The address comparing circuit 400a may provide the plurality of sub matching signals SMTCs2 and the updating signal UD2 to the data FIFO circuit 450a and may provide the switching control signal SCS2 to the first switch 235 and the second switch 237.

The data FIFO circuit 450a may include a plurality of data FIFO buffers that store in a FIFO scheme the data that is read from the memory cell array 310 in each of the plurality of read operations. When the second switch 237 is turned off (i.e., opened) in response to the switching control signal SCS2, one of data stored in the plurality of data FIFO buffers may be provided to the data I/O buffer 320 as the output data ODTA in response to the plurality of sub matching signals SMTCs2, and the data I/O buffer 320 may provide the memory controller 100a with the data signal DQ based on the output data ODTA.

When the second switch 237 is turned on (i.e., closed) in response to the switching control signal SCS2, data read from the memory cell array 310 may be provided to the data I/O buffer 320 as the output data ODTA through the data FIFO circuit 450a.

The control logic circuit 210 may control operations of the semiconductor memory device 200b. For example, the control logic circuit 210 may generate control signals for the semiconductor memory device 200b in order to perform a write operation or a read operation. The control logic circuit 210 may include a command decoder 211 that decodes the command CMD received from the memory controller 100a and a mode register 212 that sets an operation mode of the semiconductor memory device 200b.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, a second control signal CTL2 to control the quadrature error correction circuit 510 and a third control signal CTL3 to control the clock generation circuit 530. In addition, the control logic circuit 210 may provide the read signal RD to the address comparing circuit 400a in response to the command CMD designating a read operation.

Figure 11:
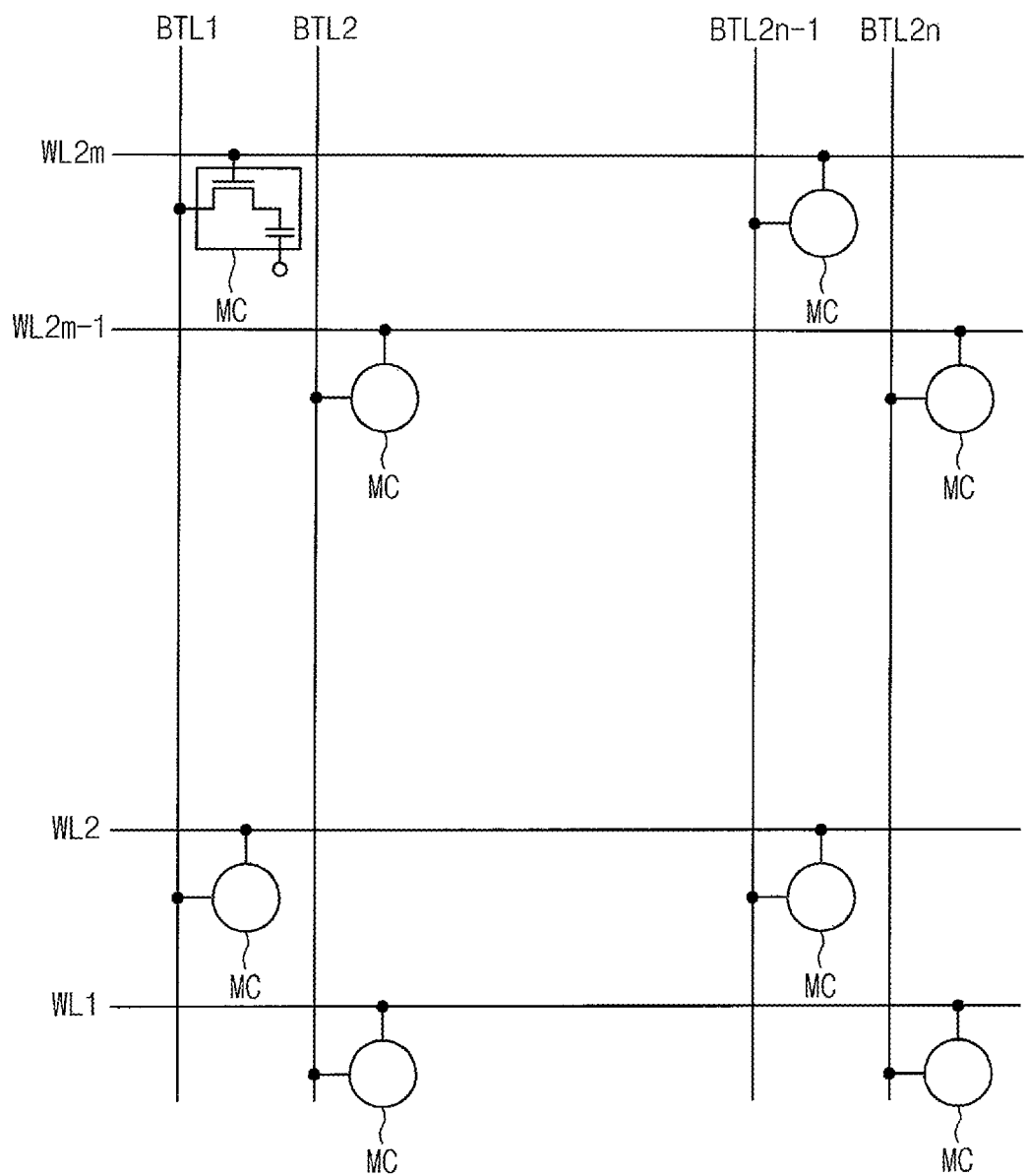
FIG. 11 illustrates an example of the first bank array in the semiconductor memory device of FIG. 10.

FIG. 11 illustrates an example of the first bank array in the semiconductor memory device of FIG. 10.

Referring to FIG. 11, the first bank array 310a may include a plurality of word-lines WL1~WL2m (where m is a natural number greater than two), a plurality of bit-lines BTL1~BTL2n (where n is a natural number greater than two), and a plurality of memory cells MCs at intersections between the word-lines WL1~WL2m and the bit-lines BTL1~BTL2n. Each of the memory cells MCs includes a cell transistor coupled to each of the word-lines WL1~WL2m and each of the bit-lines BTL1~BTL2n and a cell capacitor coupled to the cell transistor.

The word-lines WL1~WL2m coupled to the plurality of memory cells MCs may be referred to as rows of the first bank array 310a and the bit-lines BTL1~BT2Ln coupled to the plurality of memory cells MCs may be referred to as columns of the first bank array 310a.

Figure 12:
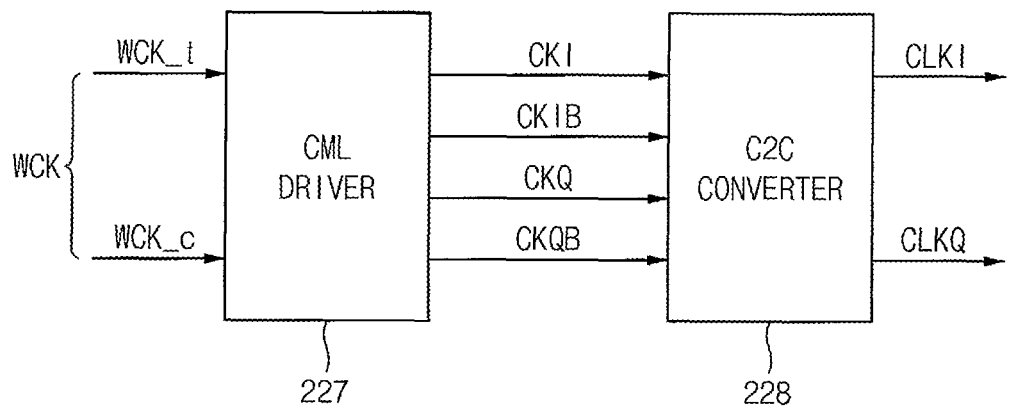
FIG. 12 is a block diagram illustrating an example of the data clock buffer in the semiconductor memory device of FIG. 10 according to some example embodiments.

FIG. 12 is a block diagram illustrating an example of the data clock buffer in the semiconductor memory device of FIG. 10 according to some example embodiments.

Referring to FIG. 12, the data clock buffer 226 may include a current mode logic (CIVIL) driver 227 and a CML to complementary metal-oxide semiconductor (CMOS) level (C2C) converter 228.

The CIVIL driver 227 may drive the data clock signal WCK including differential clock signal pair WCK_t and WCK_c and may have a CML level to generate internal clock signals CKI, CKQ, CKIB and CKQB which have a phase difference of 90 degrees with respect to one another. The C2C converter 228 may generate the first clock signal CLKI and the second clock signal CLKQ which have a phase difference of 90 degrees with respect to each other, based on the data clock signal WCK and have a CMOS level. The C2C converter 228 may provide the first clock signal CLKI and the second clock signal CLKQ to the quadrature error correction circuit 510 in FIG. 10.

Figure 13:
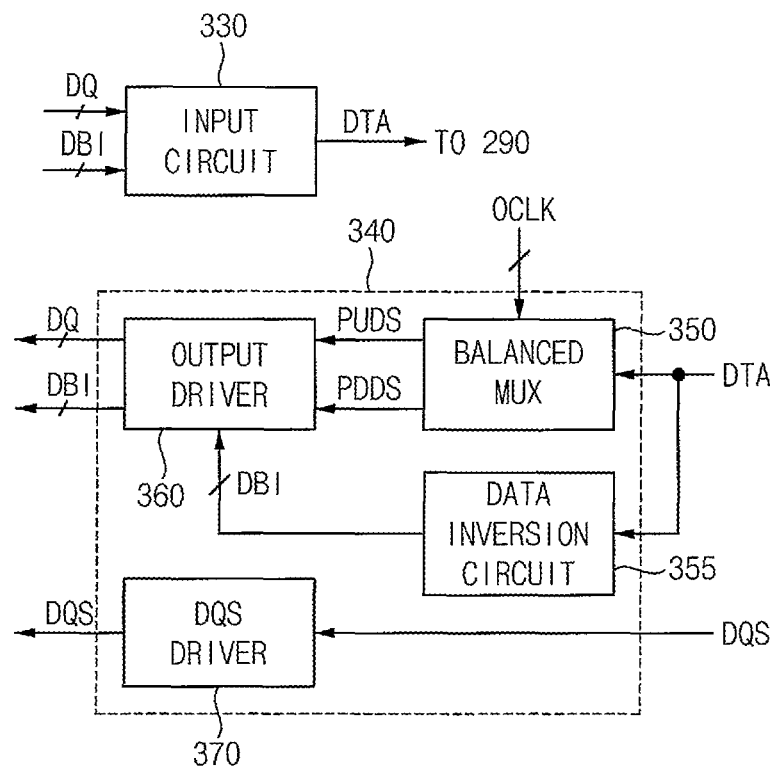
FIG. 13 illustrates an example of the data I/O buffer in the semiconductor memory device of FIG. 10 according to some example embodiments.

FIG. 13 illustrates an example of the data I/O buffer in the semiconductor memory device of FIG. 10 according to some example embodiments.

Referring to FIG. 13, the data I/O buffer 320 may include a data input circuit 330 and a data output circuit 340. The data output circuit 340 may include a balanced multiplexer 350, a data inversion circuit 355, an output driver 360 and a strobe (DQS) driver 370.

The data input circuit 330 may receive the data signal DQ and the DBI bits DBI from the memory controller 100a, may convert the data signal DQ to the data DTA, and may provide the data DTA to the I/O gating circuit 290. The data output circuit 340 may convert data DTA from the data FIFO circuit 450a to the data signal DQ and provide the data signal DQ and the DBI bits DBI to the memory controller 100a.

The balanced multiplexer 350 may receive the data DTA and the output clock signal OCLK, may generate a pull-up driving signal PUDS and a pull-down driving signal PDDS based on the data DTA and the output clock signal OCLK, and may provide the pull-up driving signal PUDS and the pull-down driving signal PDDS to the output driver 360. The balanced multiplexer 350 may generate the pull-up driving signal PUDS and the pull-down driving signal PDDS by sampling the data DTA based on the output clock signal OCLK.

For example, in some embodiments, when the data DTA is at a high level, the balanced multiplexer 350 may generate the pull-up driving signal PUDS and the pull-down driving signal PDDS for turning off all transistors included in a pull-down driver (such as a pull-down driver 363 shown in FIG. 14) of the output driver 360. Conversely, when the data DTA is at a low level, the balanced multiplexer 350 may generate the pull-down driving signal PDDS and the pull-up driving signal PUDS for turning off all transistors included in a pull-up driver (such as a pull-up driver 361 shown in FIG. 14) of the output driver 360.

The data inversion circuit 355 may receive the data DTA, may generate the DBI bits DBI indicating whether data bits of the data DTA are inverted and may provide the DBI bits DBI to the output driver 360.

The strobe driver 370 may transmit the strobe signal DQS by driving the strobe signal DQS.

Figure 14:
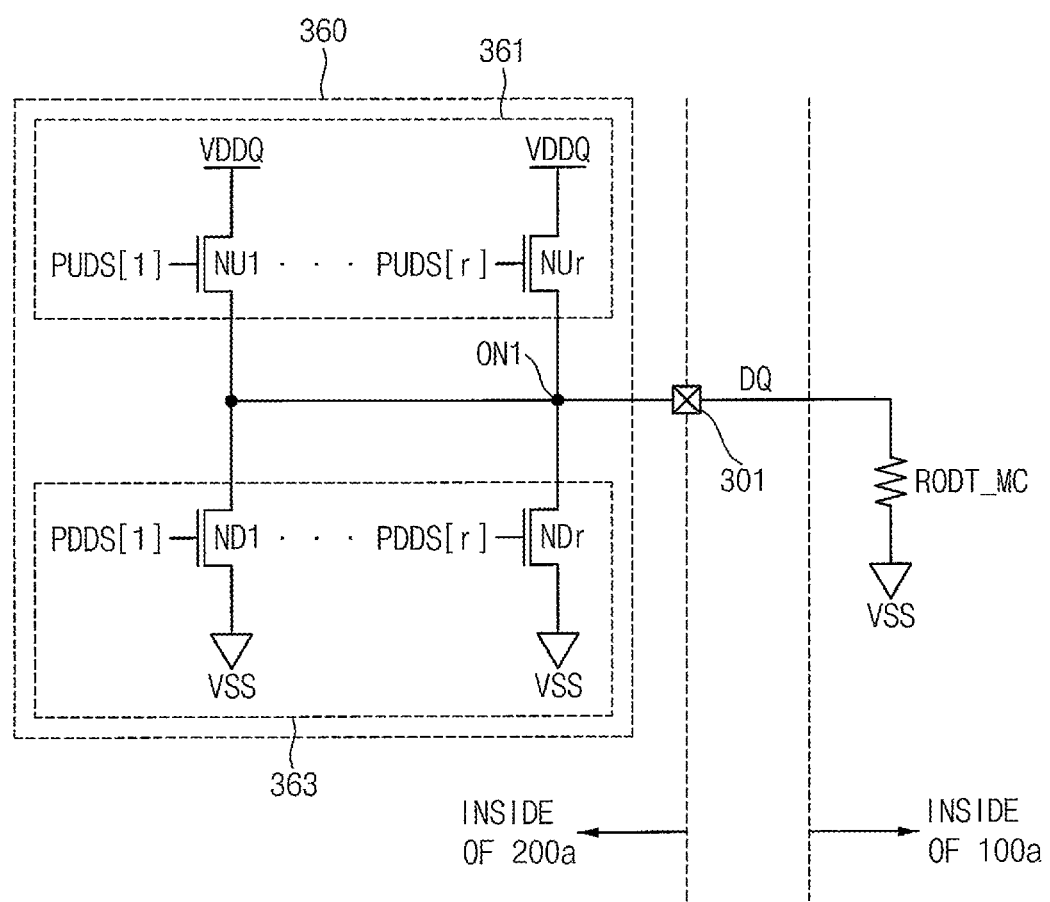
FIG. 14 illustrates a circuit diagram of an output driver in the data I/O buffer in FIG. 13 according to some example embodiments.

FIG. 14 illustrates a circuit diagram of an output driver in the data I/O buffer in FIG. 13 according to some example embodiments.

Referring to FIG. 14, the output driver 360 may include the pull-up driver 361 and the pull-down driver 363.

The pull-up driver 361 may include first through r-th (where r is a natural number greater than one) pull-up transistors NU1 through NUr connected between the power supply voltage VDDQ and an output node ON1. Each of the first through r-th pull-up transistors NU1 through NUr may be an n-channel metal oxide semiconductor (NMOS) transistor. The pull-down driver 363 may include first through r-th pull-down transistors ND1 through NDr connected between the output node ON1 and a ground voltage VSS.

Each of the first through r-th pull-down transistors ND1 through NDr may be an NMOS transistor.

When the data DTA is at the high level, the pull-up driver 361 may receive the pull-up driving signal PUDS (e.g., PUDS[1] through PUDS[r]) corresponding to the pull-up control code PUCD from the data input circuit 330 (which may be a pre-driver) or balanced multiplexer 350 and generate the current determined by the pull-up control code PUCD. The pull-down transistors ND1 through NDr included in the pull-down driver 363 may all be turned off according to the pull-down driving signal PDDS (e.g., PDDS[1] through PDDS[r]).

At this time, when the data DTA is at the high level, the current generated by the pull-up driver 361 may be transmitted to an on-die termination (ODT) resistor RODT_MC in the memory controller 100a via the data I/O (or DQ) pad 301. The data signal DQ that the ODT resistor RODT_MC receives is determined by the current generated by the pull-up driver 361 and the ODT resistor RODT_MC.

When the data DTA is at the low level, the pull-up transistors NU1 through NUr included in the pull-up driver 361 may all be turned off according to the pull-up driving signal PUDS. The pull-down driver 363 may receive the pull-down driving signal PDDS corresponding to the pull-down control code PDCD from the data input circuit 330 or balanced multiplexer 350 and may have a resistance determined by the pull-down control code PDCD.

At this time, when the data DTA is at the low level, no current is generated by the pull-up driver 361, and therefore, the data signal DQ that the ODT resistor RODT_MC receives has an output low level voltage (VOL) voltage which is substantially the same as the ground voltage VSS.

According to some example embodiments, the total resistance, e.g., a termination resistance (RTT), of the pull-up driver 361 or the pull-down driver 363 may be changed in response to a particular pull-up or pull-down driving signal PUDS or PDDS.

Figure 15:
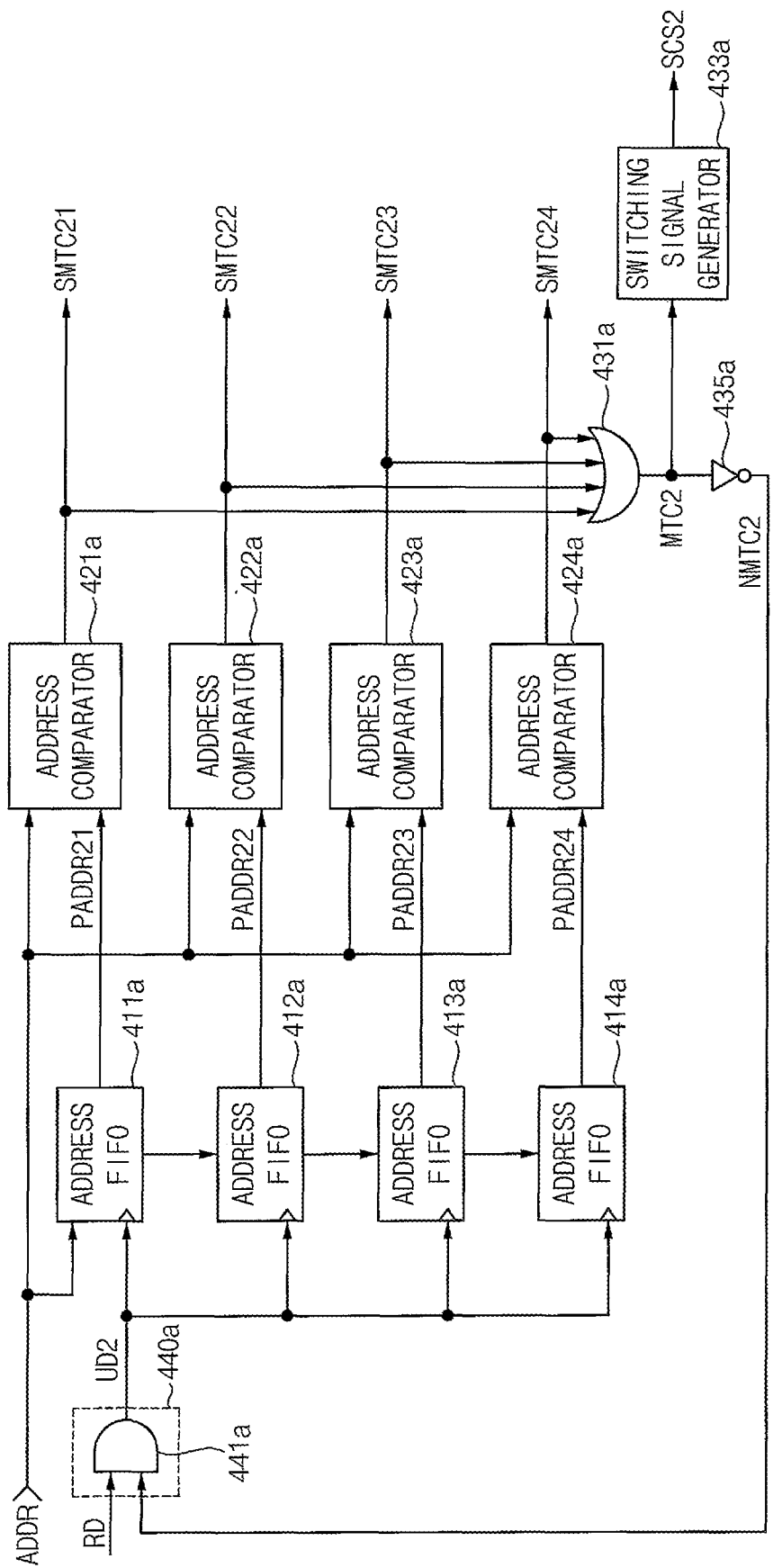
FIG. 15 is a block diagram illustrating an example of the address comparing circuit in the semiconductor memory device of FIG. 10 according to some example embodiments.

FIG. 15 is a block diagram illustrating an example of the address comparing circuit in the semiconductor memory device of FIG. 10 according to some example embodiments.

Referring to FIG. 15, the address comparing circuit 400a may include a plurality of address FIFO buffers 411a, 412a, 413a and 414a, a plurality of address comparators 421a, 422a, 423a and 424a, an OR gate 431a, an inverter 435a, a switching signal generator 433a and an updating signal generator 440a.

The plurality of address FIFO buffers 411a, 412a, 413a and 414a may store, in a FIFO manner, a plurality of addresses accompanied by the plurality of read operations in response to the plurality of addresses not matching one another. The plurality of address comparators 421a, 422a, 423a and 424a may compare a current or present address ADDR that is currently or presently accessed with respective one of the plurality of previous addresses PADDR21, PADDR22, PADDR23 and PADDR24 stored in the plurality of address FIFO buffers 411a, 412a, 413a and 414a and generate a plurality of sub matching signals SMTC21, SMTC22, SMTC23 and SMTC24, respectively.

The OR gate 431a may perform an OR operation on the plurality of sub matching signals SMTC21, SMTC22, SMTC23 and SMTC24 and may generate a matching signal MTC2. When the current or present address ADDR matches one of the previous addresses PADDR21, PADDR22, PADDR23 and PADDR24, one of the sub matching signals SMTC21, SMTC22, SMTC23 and SMTC24 may have a first logic level (i.e., a logic high level) and the OR gate 431a may output the matching signal MTC2 having a first logic level.

The switching signal generator 433a may generate the switching control signal SCS2 that is applied to the first switch 235 and the second switch 237, based on the matching signal MTC2. The switching signal generator 433a may generate the switching control signal SCS2 that turns off (and opens) the first switch 235 and the second switch 237, based on the matching signal MTC2 having the first logic level. In other words, if the current or present address ADDR matches one of the previous addresses PADDR21, PADDR22, PADDR23 and PADDR24, then the switching signal generator 433a may generate the switching control signal SCS2 that turns off (and opens) the first switch 235 and the second switch 237, thereby disconnecting the CA latch 250 from the address register 220 and disconnecting the I/O gating circuit 290 from the data FIFO circuit 450a. The switching signal generator 433a may generate the switching control signal SCS2 that turns on the first switch 235 and the second switch 237, based on the matching signal MTC2 having a second logic level (i.e., a logic low level). In other words, if the current or present address ADDR does not match one of the previous addresses PADDR21, PADDR22, PADDR23 and PADDR24, then the switching signal generator 433a may generate the switching control signal SCS2 that turns on (and closes) the first switch 235 and the second switch 235, thereby connecting the CA latch 250 to the address register 220 and connecting the I/O gating circuit 290 to the data FIFO circuit 450a.

The inverter 435a may invert the matching signal MTC2 and may generate a no matching signal NMTC2 and may provide the no matching signal NMTC2 to the updating signal generator 440a.

The updating signal generator 440a may generate the updating signal UD2 based on the no matching signal NMTC2 and the read signal RD and may provide the updating signal UD2 to the address FIFO buffers 411a, 412a, 413a and 414a. The updating signal generator 440a may include an AND gate 441a that outputs the updating signal UD12 by performing an AND operation on the no matching signal NMTC2 and the read signal RD.

Therefore, the updating signal generator 440a may output the updating signal UD2 having a first logic level when the read signal RD has a first logic level and the no matching signal NMTC2 has the first logic level. The updating signal generator 440a may output the updating signal UD2 having a first logic level when respective one of the sub matching signals SMTC21, SMTC22, SMTC23 and SMTC24 has a second logic level because the current or present address ADDR does not match respective one of the previous addresses PADDR21, PADDR22, PADDR23 and PADDR24.

Each of the address FIFO buffers 411a, 412a and 413a may shift respective one of the previous addresses PADDR21, PADDR22 and PADDR23 stored therein to each of the address FIFO buffers 412a, 413a and 414a, in response to a rising edge of the updating signal UD2.

Figure 16:
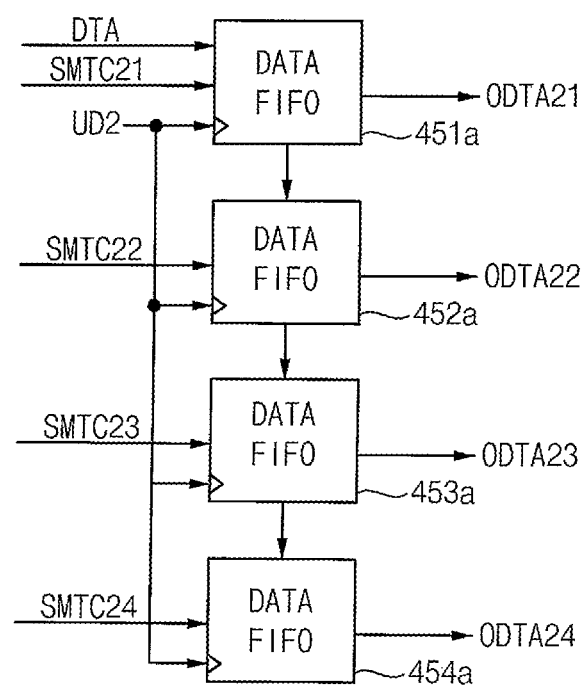
FIG. 16 is a block diagram illustrating an example of the data FIFO circuit in the semiconductor memory device of FIG. 10 according to some example embodiments.

FIG. 16 is a block diagram illustrating an example of the data FIFO circuit in the semiconductor memory device of FIG. 10 according to some example embodiments.

Referring to FIG. 16, the data FIFO circuit 450a may include a plurality of data FIFO buffers 451a, 452a, 453a and 454a.

The plurality of data FIFO buffers 451a, 452a, 453a and 454a may store different data that is read from the memory cell array 310 in each of a plurality of read operations, based on FIFO scheme. The data DTA may be sequentially shifted to the data FIFO buffers 451a, 452a, 453a and 454a and may be sequentially stored in the data FIFO buffers 451a, 452a, 453a and 454a.

Each of the data FIFO buffers 451a, 452a, 453a and 454a may output data stored therein to the data I/O buffer 320 as respective one of output data ODTA21, ODTA22, ODTA23 and ODTA24 in response to corresponding one of the sub matching signals SMTC21, SMTC22, SMTC23 and SMTC24.

When one of the sub matching signals SMTC21, SMTC22, SMTC23 and SMTC24 has a first logic level, a data FIFO buffer from among the data FIFO buffers 451a, 452a, 453a and 454a that receives the sub matching signal having a first logic level may output data stored therein to the data I/O buffer 320 as an output data.

The data FIFO buffers 451a, 452a, 453a and 454a may receive the updating signal UD2. Each of the data FIFO buffers 451a, 452a and 453a may shift the data stored therein to each of the data FIFO buffers 452a, 453a and 454a, in response to a rising edge of the updating signal UD2, when each of the sub matching signals SMTC21, SMTC22, SMTC23 and SMTC24 has a second logic level because the current address or present ADDR does not match the previous addresses PADDR21, PADDR22, PADDR23 and PADDR24.

Operations of the data comparing circuit 400a of FIG. 15 and the data FIFO circuit 450a of FIG. 16 are substantially similar with operations of the data comparing circuit 400 of FIG. 6 and the data FIFO circuit 450 of FIG. 7, and thus, repeated descriptions will be omitted.

Figure 17:
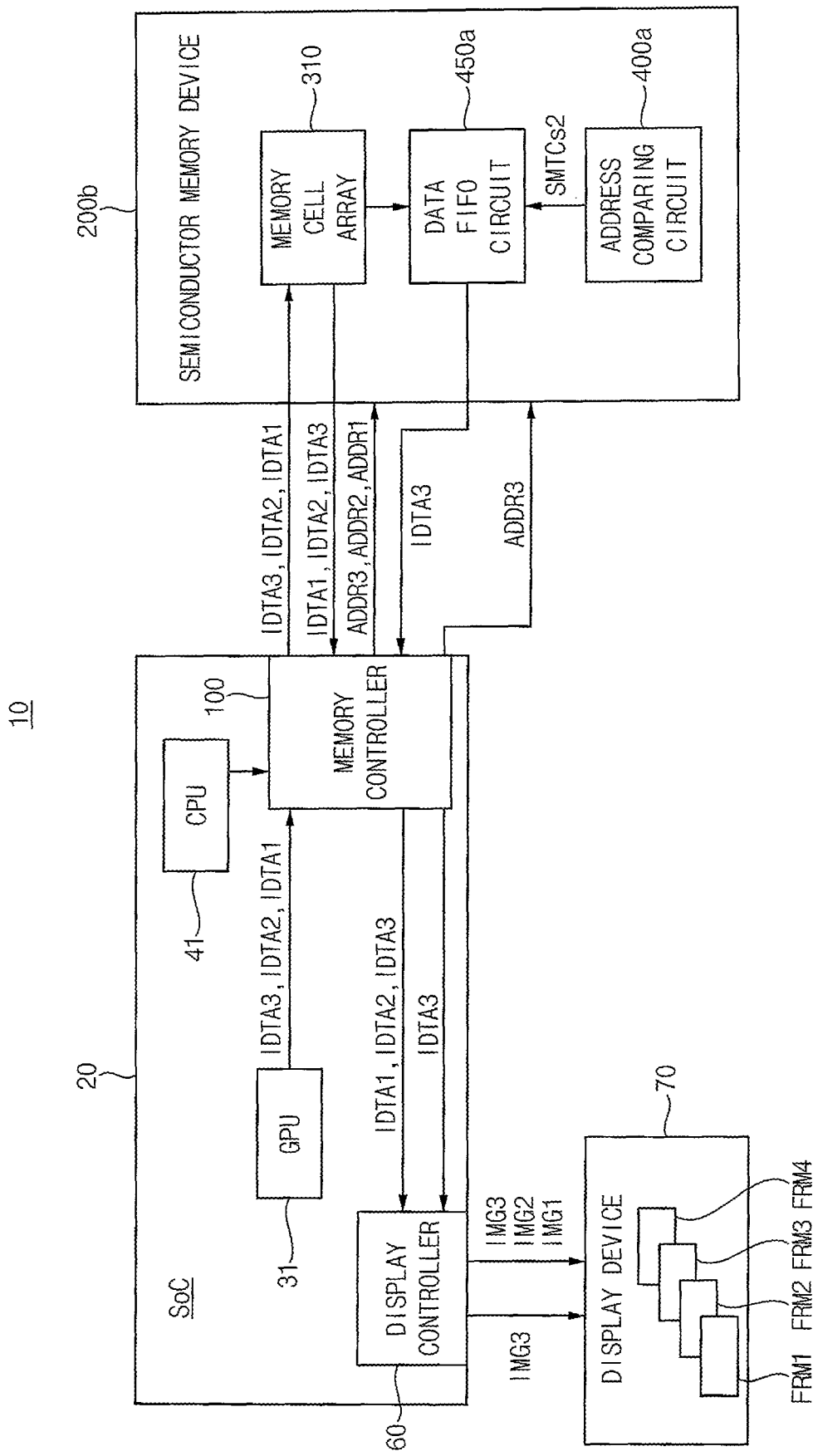
FIG. 17 illustrates an operation of the electronic device of FIG. 1 according to some example embodiments.

FIG. 17 illustrates an operation of the electronic device of FIG. 1 according to some example embodiments.

In FIG. 17, it is assumed that the first semiconductor memory device 200 in FIG. 1 employs the semiconductor memory device 200b of FIG. 10.

Referring to FIG. 17, the GPU 31 may generate first through third image data IDTA1, IDTA2 and IDTA3 by rendering at least one object, and the CPU 41 may control the first memory controller 100 to store the first through third image data IDTA1, IDTA2 and IDTA3 in the memory cell array 310 of the semiconductor memory device 200b.

For displaying the first through third image data IDTA1, IDTA2 and IDTA3 stored in the memory cell array 310 as first through third frames FRM1, FRM2 and FRM3 in the display device 70, the CPU 41 applies read commands and first through third addresses ADDR1, ADDR2, ADDR3 designating pages storing the first through third image data IDTA1, IDTA2 and IDTA3 to the semiconductor memory device 200b through the first memory controller 100. The semiconductor memory device 200b reads the first through third image data IDTA1, IDTA2 and IDTA3 based on the first through third addresses ADDR1, ADDR2, ADDR3, and may store the first through third addresses ADDR1, ADDR2, ADDR3 in the data FIFO circuit 450a while providing the first through third addresses ADDR1, ADDR2, ADDR3 to the first memory controller 100.

The first memory controller 100 provides the first through third image data IDTA1, IDTA2 and IDTA3 to the display controller 60, and the display controller 60 may provide first through third images IMG1, IMG2 and IMG3 to the display device 70 by processing the first through third image data IDTA1, IDTA2 and IDTA3. The first through third images IMG1, IMG2 and IMG3 may be displayed in the display device 70 as the first through third frames FRM1, FRM2 and FRM3.

For displaying the third image data IDTA3 stored in the memory cell array 310 as a fourth frame FRM4 in the display device 70, the CPU 41 applies a read command and the third address ADDR3 designating a page storing the third image data IDTA3 to the semiconductor memory device 200a through the first memory controller 100. The address comparing circuit 400a compares the third address ADDR3 with respective one of previous addresses stored therein and may provide the data FIFO circuit 450a with the sub matching signals SMTCs2 indicating that the present third address ADDR3 matches one of the previous addresses.

The data FIFO circuit 450a, in response to the sub matching signals SMTCs2, may provide the first memory controller 100 with the third image data IDT3 stored in a data FIFO buffer corresponding to the third address ADDR3, and the first memory controller 100 may provide the third image data IDTA3 to the display controller 60.

The display controller 60 may provide the third image IMG3 to the display device 70 by processing the third image data IDTA3 and the third image IMG3 may be displayed in the display device 70 as the fourth frame FRM4.

That is, when an image to be displayed in the display device 70 in a current frame is the same as one of a predetermined range of previous frames, the semiconductor memory device 200b may provide the display device 70 with the plurality of image data stored in one of the plurality of data FIFO buffers through the memory controller 100 and the display controller 60.

Figure 18:
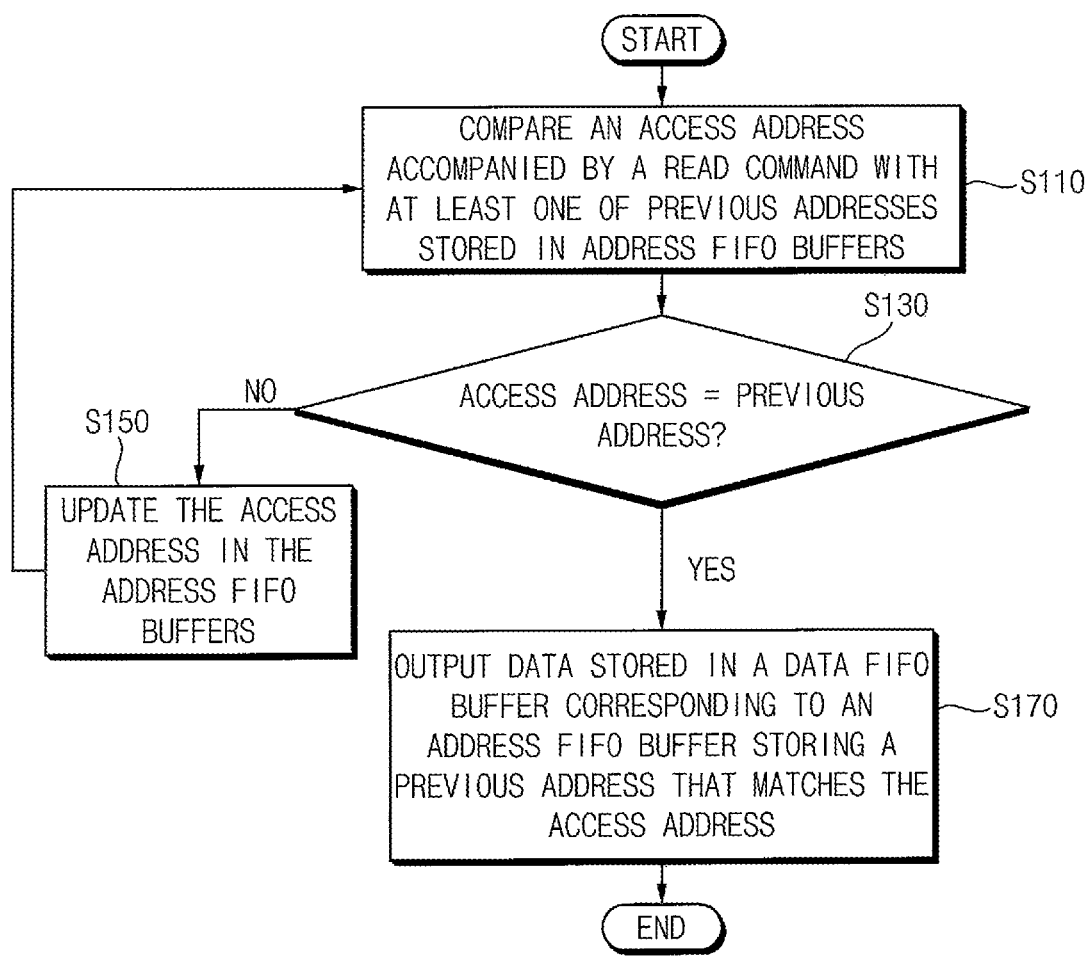
FIG. 18 is a flow chart illustrating a method of reading data in a semiconductor memory device according to some example embodiments.

FIG. 18 is a flow chart illustrating a method of reading data in a semiconductor memory device according to some example embodiments.

Referring to FIGS. 3 through 16 and 18, in a method of reading data in a semiconductor memory device 200b that includes a memory cell array 310, an address comparing circuit 400a and a data FIFO circuit 450a, the address comparing circuit 400a may compare an access address accompanied by a present or instant read command with at least one previous address stored in address FIFO buffers (operation S110).

The address comparing circuit 400a may determine whether the access address matches the at least one previous address (operation S130).

When the access address does not match the at least one previous address (NO in operation S130), the address comparing circuit 400a may update the access address in the address FIFO buffers (operation S150) and the process may return to the operation S110.

When the access address matches the at least one previous address (YES in operation S130), the address comparing circuit 400a and the data FIFO circuit 450a may output data stored in a data FIFO buffer corresponding to an address FIFO buffer storing the previous address that matches the access address (operation S170).

Therefore, when a same address associated with a same data is input to the address comparing circuit 400a, the address comparing circuit 400a and the data FIFO circuit 450a may output the same data in one of the data FIFO buffers instead of outputting the same data read from the memory cell array 310 to reduce current consumption associated with a read operation.

Figure 19:
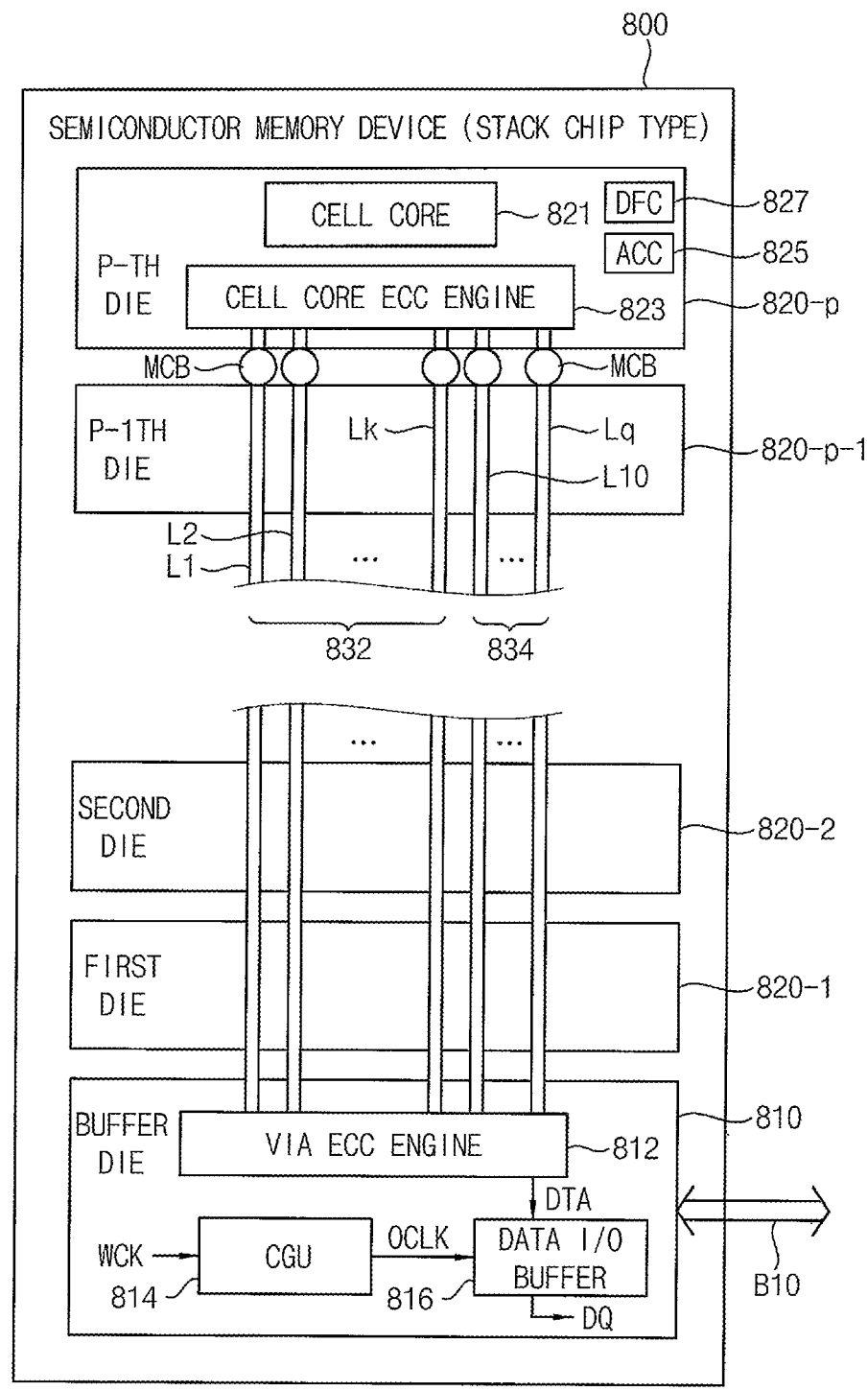
FIG. 19 is a block diagram illustrating a semiconductor memory device according to some example embodiments.

FIG. 19 is a block diagram illustrating a semiconductor memory device according to some example embodiments.

Referring to FIG. 19, a semiconductor memory device 800 may include at least one buffer die 810 and a plurality of memory dies 820-1 to 820-p (where p is a natural number equal to or greater than three) that provide a soft error analyzing and correcting function in a stacked chip structure.

The plurality of memory dies 820-1 to 820-*p* may be stacked on the buffer die 810 and convey data through a plurality of through silicon via (TSV) lines, more generally described as through substrate via lines.

Each of the memory dies 820-1 to 820-*p* may include a cell core 821 to store data and a cell core ECC engine 823 which generates transmission parity bits (i.e., transmission parity data) based on transmission data to be sent to the at least one buffer die 810. The cell core 821 may include a plurality of memory cells having DRAM cell structure, a row decoder, and a column decoder. Each of the memory dies 820-1 to 820-*p* may include may further include an address comparing circuit ACC 825 and a data FIFO circuit DFC 827.

The address comparing circuit 825 may employ the address comparing circuit 400 of FIG. 5 and the data FIFO circuit 827 may employ the data FIFO circuit 450 of FIG. 6. Therefore, when a same address associated with a same data is input to the address comparing circuit 825, each of the memory dies 820-1 to 820-*p* may output the same data in one of the data FIFO buffers instead of outputting the same data read from the cell core 821 to reduce current consumption associated with a read operation.

The buffer die 810 may include a via ECC engine 812 which corrects a transmission error using the transmission parity bits when a transmission error is detected from the transmission data received through the TSV lines. The via ECC engine 812 may generate error-corrected data.

The buffer die 810 may further include a clock generation unit (CGU 814 and a data I/O buffer 816. The CGU 814 may generate corrected clock signals whose duty and skew are adjusted (e.g., concurrently adjusted) based on the data clock signal WCK and may generate the output clock signal OCLK based on the corrected clock signals. The data I/O buffer 816 may generate the data signal DQ by sampling the data DTA from the via ECC engine 812 and may output the data signal DQ to an outside.

The semiconductor memory device 800 may be a stack chip type memory device or a stacked memory device which conveys data and control signals through the TSV lines. The TSV lines may be also called 'through electrodes.'

The cell core ECC engine 823 may perform error correction on data which is outputted from the memory die 820-*p* before the transmission data is sent.

A data TSV line group 832 which is formed at one memory die 820-*p* may include data TSV lines L1, L2 to Lk (e.g., 128 data TSV lines), and a parity TSV line group 834 may include parity TSV lines L10 to Lq (e.g., 8 parity TSV lines). The data TSV lines L1, L2 to Lk of the data TSV line group 832 and the parity TSV lines L10 to Lq of the parity TSV line group 834 may be connected to micro bumps MCB which are correspondingly formed among the memory dies 820-1 to 820-*p*.

The semiconductor memory device 800 may have a three-dimensional (3D) chip structure or a 2.5D chip structure to communicate with the host through a data bus B10. The buffer die 810 may be connected with the memory controller through the data bus B10. The semiconductor memory device 800 may be part of a semiconductor memory package.

According to some example embodiments, as illustrated in FIG. 19, the cell core ECC engine 823 may be included in the memory die, the via ECC engine 812 may be included in the buffer die. Accordingly, it may be possible to detect and correct soft data failure. The soft data failure may be or may include a transmission error which is generated due to noise when data is transmitted through TSV lines.

Figure 20:
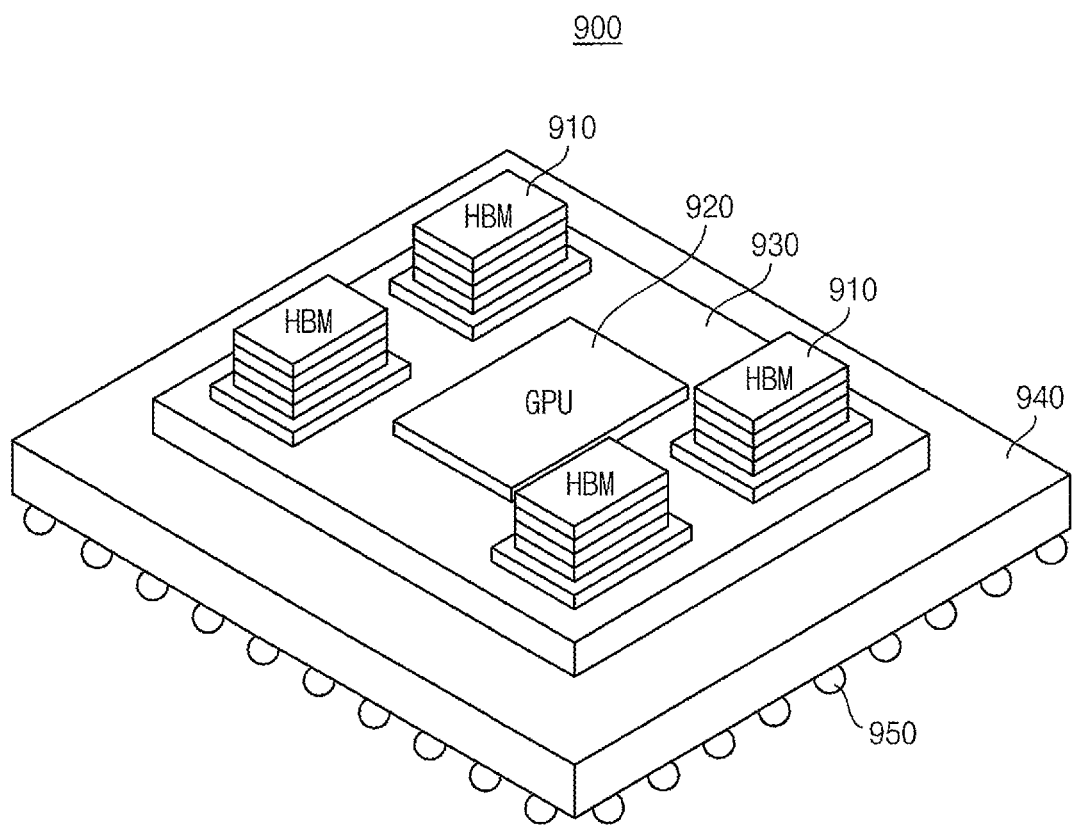
FIG. 20 is a configuration diagram illustrating a semiconductor package including the stacked memory device according to some example embodiments.

FIG. 20 is a configuration diagram illustrating a semiconductor package including the stacked memory device according to some example embodiments.

Referring to FIG. 20, a semiconductor package 900 may include one or more stacked memory devices 910 and a GPU 920.

The stacked memory devices 910 and the GPU 920 may be mounted on an interposer 930, and the interposer 930 on which the stacked memory device 910 and the GPU 920 are mounted may itself be mounted on a package substrate 940 mounted on solder balls 950.

The GPU 920 may correspond to a semiconductor device which may perform a memory control function, and for example, the GPU 920 may be implemented as an application processor.

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and each of the plurality of memory dies may include a cell core, an address comparing circuit and a data FIFO circuit as mentioned above.

The GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

Some aspects of the present disclosure may be applied to systems using semiconductor memory devices that employ volatile memory cells. For example, some aspects of the present disclosure may be applied to systems such as a smart phone, a navigation system, a notebook computer, a desktop computer and/or a game console that use the semiconductor memory device as a working memory.

The foregoing is illustrative of example embodiments and is not to be construed as limiting thereof. Although some example embodiments have been described, those skilled in the art will readily appreciate that many modifications to the described example embodiments are possible without materially departing from the novel teachings and advantages of the present disclosure. Accordingly, all such modifications are intended to be included within the scope of the present inventive concepts as defined in the claims.

What is claimed is:

1. A semiconductor memory device comprising:
   a memory cell array including a plurality of volatile memory cells coupled to a plurality of word-lines and a plurality of bit-lines;
   a data input/output (I/O) buffer configured to provide the memory cell array with write data received in each of a plurality of write operations;
   a data first-in/first-out (FIFO) circuit including a plurality of data FIFO buffers configured to store read data that is read from the memory cell array in each of a plurality of read operations, the data FIFO circuit configured to output data stored in one of the plurality of data FIFO buffers based on a plurality of sub matching signals;
   an address comparing circuit configured to sequentially store a plurality of previous addresses that accompany first commands that designate a plurality of previous read operations, and configured to generate the plurality of sub matching signals based on a comparison of the previous addresses with a present address that accompanies a second command designating a present read operation; and a control logic circuit configured to receive the first commands and the second command and configured to provide a read signal to the address comparing circuit in response to the first commands and the second command designating the plurality of previous read operations and the present read operation.

2. The semiconductor memory device of claim 1, further comprising:

a first switch connected between an address buffer configured to receive the previous addresses and the present address and a column decoder coupled to the plurality of bit-lines; and a second switch connected between the data FIFO circuit and an I/O gating circuit connected to the memory cell array.

3. The semiconductor memory device of claim 2, wherein, in response to the present address matching one of the previous addresses, the address comparing circuit is configured to open the first switch and the second switch by applying a switching control signal to the first switch and the second switch.

4. The semiconductor memory device of claim 2, wherein, in response to the present address not matching each of the previous addresses, the address comparing circuit is configured to close the first switch and the second switch by applying a switching control signal to the first switch and the second switch.

5. The semiconductor memory device of claim 2, wherein the address comparing circuit includes:

a first address FIFO buffer configured to store a first address of the plurality of previous addresses;

a second address FIFO buffer;

a first address comparator configured to compare the present address with the first address stored in the first address FIFO buffer and generate a first sub matching signal indicating whether the present address matches the first address;

an updating signal generator configured to generate an updating signal based on a no matching signal that is generated based on the first sub matching signal; and a switching signal generator configured to generate a switching control signal that is applied to the first switch and the second switch, based on a matching signal that is generated based on the first sub matching signal.

6. The semiconductor memory device of claim 5, wherein, in response to the first sub matching signal indicating that the present address does not match the first address, the first address FIFO buffer is configured to shift the first address to the second address FIFO buffer and store the first address therein, based on the updating signal, and the switching signal generator is configured to close the first switch and the second switch by applying a switching control signal to the first switch and the second switch.

7. The semiconductor memory device of claim 5, wherein the address comparing circuit includes:

a second address comparator configured to compare a second address of the plurality of previous addresses with the present address and generate a second sub matching signal indicating whether the second address matches the present address.

8. The semiconductor memory device of claim 5, wherein, in response to the first sub matching signal indicating that the present address matches the first address, the switching signal generator is configured to open the first switch and the second switch by applying a switching control signal to the first switch and the second switch, and a first data FIFO buffer associated with the first address, from among the plurality of data FIFO buffers is configured to provide the data I/O buffer with a first data stored therein, in response to the first sub matching signal.

9. The semiconductor memory device of claim 1, further comprising:

a first switch connected between an address buffer configured to receive the previous addresses and the present address and a column decoder coupled to the plurality of bit-lines; and a second switch connected between the data FIFO circuit and an I/O gating circuit connected to the memory cell array, and wherein the address comparing circuit includes:

a plurality of address FIFO buffers configured to store the plurality of previous addresses;

a plurality of address comparators each configured to compare the present address with a respective one of the plurality of previous addresses stored in the plurality of address FIFO buffers and generate a sub matching signal, resulting in a plurality of sub matching signals;

an OR gate configured to perform an OR operation on the plurality of sub matching signals and generate a matching signal;

an inverter configured to invert the matching signal and generate a no matching signal;

an updating signal generator configured to generate an updating signal based on the no matching signal and the read signal; and a switching signal generator configured to generate a switching control signal that is applied to the first switch and the second switch, based on the matching signal.

10. The semiconductor memory device of claim 9, wherein, in response to one of the plurality of sub matching signals indicating that the present address matches one of the plurality of previous addresses, the switching signal generator is configured to open the first switch and the second switch by applying a switching control signal to the first switch and the second switch, and a data FIFO buffer from among the plurality of data FIFO buffers that is associated with the previous address that matches the present address is configured to provide the data I/O buffer with data stored therein.

11. The semiconductor memory device of claim 9, wherein, in response to the no matching signal indicating that the present address does not match any of the plurality of previous addresses, the plurality of data FIFO buffers are configured to store data associated with the present address in a FIFO manner.

12. The semiconductor memory device of claim 9, wherein the updating signal generator is configured to generate the updating signal by performing an AND operation on the no matching signal and the read signal.

13. The semiconductor memory device of claim 1, wherein the control logic circuit includes a command decoder configured to decode the first commands and the second command, and
wherein the command decoder is configured to generate the read signal when one of the first commands and the second command designate one of the plurality of previous read operations and the present read operation.

14. The semiconductor memory device of claim 1, wherein the control logic circuit is configured to store image data in the memory cell array in each of the plurality of write operations.

15. A semiconductor memory device comprising:
a memory cell array including a plurality of volatile memory cells coupled to a plurality of word-lines and a plurality of bit-lines;
a data input/output (I/O) buffer configured to provide the memory cell array with write data in each of a plurality of write operations;
a data first-in/first-out (FIFO) circuit including a plurality of data FIFO buffers configured to store sequentially read data that is read from the memory cell array in each of a plurality of first read operations, the data FIFO circuit configured to output data stored in one of the plurality of data FIFO buffers based on a plurality of sub matching signals;
an address comparing circuit configured to store sequentially first addresses accompanied by first commands designating the plurality of first read operations, and configured to generate the plurality of sub matching signals based on a comparison of a second address and the first addresses, the second address accompanied by a second command designating a second read operation;
a control logic circuit configured to receive the first commands and the second command and configured to provide a read signal to the address comparing circuit in response to the first commands and the second command designating the plurality of first read operations and the second read operation;
a first switch connected between an address buffer configured to receive the first addresses and the second address and a column decoder coupled to the plurality of bit-lines; and
a second switch connected between the data FIFO circuit and an I/O gating circuit connected to the memory cell array, and
wherein, in response to one of the plurality of sub matching signals indicating that the second address matches one of the plurality of first addresses, the address comparing circuit is configured to turn off the first switch and the second switch by applying a switching control signal to the first switch and the second switch, and
wherein, in response to the one of the plurality of sub matching signals, a data FIFO buffer from the plurality of data FIFO buffers that is associated with a first address that matches the second address is configured to provide the data I/O buffer with data stored therein.

16. A semiconductor memory device comprising:
a memory cell array including a plurality of volatile memory cells coupled to a plurality of word-lines and a plurality of bit-lines;
a data input/output (I/O) buffer configured to provide the memory cell array with write data received in each of a plurality of write operations;
a data first-in/first-out (FIFO) circuit including a plurality of data FIFO buffers configured to store read data that is read from the memory cell array in each of a plurality of read operations, the data FIFO circuit configured to output data stored in one of the plurality of data FIFO buffers based on a plurality of sub matching signals; and
an address comparing circuit including a plurality of address FIFO buffers that correspond in number with the plurality of data FIFO buffers, each address FIFO buffer configured to store therein one of a plurality of previous addresses each received during respective previous read operations, the address comparing circuit configured to generate a respective one of the plurality of sub matching signals based on a comparison of the previous address stored in each address FIFO buffer with a present address that accompanies a present read operation.

17. The semiconductor memory device of claim 16, wherein the plurality of address FIFO buffers includes a first address FIFO buffer, and wherein the address comparing circuit includes:
a first address comparator configured to compare the present address with a first address stored in the first address FIFO buffer and generate a first sub matching signal indicating whether the present address matches the first address; and
an updating signal generator configured to generate an updating signal based on a no matching signal that is generated based on the first sub matching signal.

18. The semiconductor memory device of claim 17, wherein the plurality of address FIFO buffers includes a second address FIFO buffer, and wherein, in response to the first sub matching signal indicating that the present address does not match the first address, the address comparing circuit is configured to shift the first address from the first address FIFO buffer to the second address FIFO buffer and store the first address in the second address FIFO buffer, based on the updating signal.

19. The semiconductor memory device of claim 17, wherein the plurality of address FIFO buffers includes a second address FIFO buffer, and wherein the address comparing circuit includes:
a second address comparator configured to compare a second address stored in the second address FIFO buffer with the present address and generate a second sub matching signal indicating whether the second address matches the present address.

20. The semiconductor memory device of claim 16, further comprising:
an address buffer configured to receive the previous addresses and the present address'
a column decoder coupled to the plurality of bit-lines;
an I/O gating circuit connected to the memory cell array;
a first switch connected between the address buffer and the present address and the column decoder;
a second switch connected between the data FIFO circuit and the I/O gating circuit; and
a switching signal generator configured to generate a switching control signal that is applied to the first switch and the second switch, based on a matching signal that is generated based on the plurality of sub matching signals.

* * * * *